(12) United States Patent
Shim et al.

(10) Patent No.: US 8,027,197 B2
(45) Date of Patent: Sep. 27, 2011

(54) NONVOLATILE MEMORY DEVICE

(75) Inventors: Sunil Shim, Seoul (KR); Sunghoi Hur, Seoul (KR); Younggoan Jang, Anyang-si (KR); Jinho Kim, Hwaseong-si (KR); Su-Youn Yi, Yongin-si (KR); HuiChang Moon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 113 days.

(21) Appl. No.: 12/584,674

(22) Filed: Sep. 10, 2009

(65) Prior Publication Data
US 2010/0097859 A1  Apr. 22, 2010

(30) Foreign Application Priority Data
Oct. 16, 2008  (KR) .................. 10-2008-0101607

(51) Int. Cl.
*G11C 11/34* (2006.01)
(52) U.S. Cl. .............................. 365/185.05; 365/185.24
(58) Field of Classification Search ............. 365/185.05, 365/185.24
See application file for complete search history.

(56) References Cited

U.S. PATENT DOCUMENTS

| | | | |
|---|---|---|---|
| 7,031,179 B2 | 4/2006 | Yon et al. | |
| 2005/0152170 A1 | 7/2005 | Yon et al. | |
| 2007/0158736 A1 | 7/2007 | Arai et al. | |
| 2008/0258203 A1* | 10/2008 | Happ et al. | 257/324 |

FOREIGN PATENT DOCUMENTS

| | | |
|---|---|---|
| JP | 10-93083 | 4/1998 |
| JP | 2007-180389 | 7/2007 |
| KR | 10-0521386 | 10/2005 |

* cited by examiner

*Primary Examiner* — Michael Tran
(74) *Attorney, Agent, or Firm* — Onello & Mello LLP

(57) ABSTRACT

A nonvolatile memory device having a three-dimensional structure includes first word line stacks in which first word lines are stacked; second word line stacks in which second word lines parallel to the first word lines are stacked; first connection lines connecting the first word lines; and second connection lines connecting the second word lines. Each of the first connection lines connects the first word lines located at a common layer, each of the second connection lines connects the second word lines located at a common layer and at least one second word line stack is disposed between a pair of the first word line stacks.

18 Claims, 30 Drawing Sheets

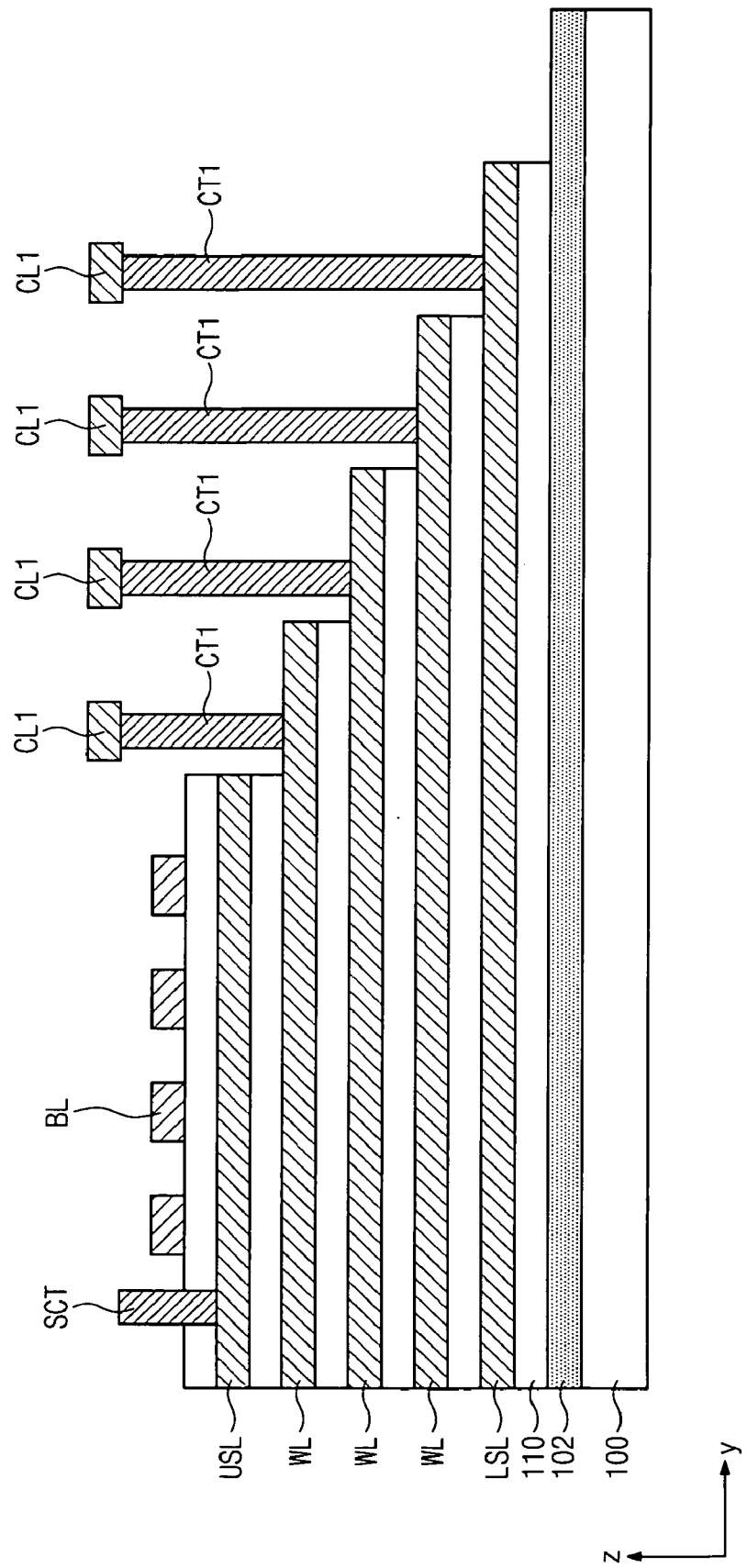

NONVOLATILE MEMORY DEVICE

CROSS-REFERENCE TO RELATED APPLICATIONS

This U.S. non-provisional patent application claims priority under 35 U.S.C. §119 of Korean Patent Application No. 10-2008-0101607, filed on Oct. 16, 2008, the entire contents of which are herein incorporated by reference.

BACKGROUND

The exemplary embodiments described herein relate to nonvolatile memory devices, and more particularly, to NAND type flash memory devices of a three-dimensional structure having a high degree of integration.

Generally, nonvolatile memory devices can electrically erase data and electrically store data. Nonvolatile memory devices can also retain their stored data when their power supplies are interrupted. Recently, nonvolatile memory devices have been widely used in various fields.

Nonvolatile memory devices include memory cell transistors of various types and may be classified into a NAND type and a NOR type according to a cell array structure in the devices. NAND type nonvolatile memory devices and NOR type nonvolatile memory devices have advantages of high integration and high speed, respectively.

Since a NAND type nonvolatile memory device has a cell string structure connecting a plurality of memory cells in series, they are conducive to high integration. Also, since a NAND type nonvolatile memory device adopts an operation method of simultaneously changing data stored in a plurality of memory cells, a speed of updating data is very high compared with a NOR type nonvolatile memory device. NAND type nonvolatile memory devices are mainly used in portable electronic devices requiring a mass storage such as a digital camera or a MP3 player because of high integration and high update speed.

A NAND type nonvolatile memory device of a three-dimensional structure is being developed.

SUMMARY

The exemplary embodiments provide a nonvolatile memory device. The nonvolatile memory device may include first word line stacks in which first word lines are stacked; second word line stacks in which second word lines parallel to the first word lines are stacked; first connection lines connecting the first word lines; and second connection lines connecting the second word lines. Each of the first connection lines connects the first word lines located at a common first word line layer, each of the second connection lines connects the second word lines located at a common second word line layer, and at least one second word line stack is disposed between a pair of the first word line stacks.

In one embodiment, the first and second word line stacks are alternately disposed one by one.

In one embodiment, a pair of the first word line stacks adjacent to each other forms a plurality of first groups, wherein a pair of the second word line stacks adjacent to each other forms a plurality of second groups and wherein the first and second groups are alternately disposed one by one.

In one embodiment, the first connection lines are electrically separated from the second word lines and the second connection lines are electrically separated from the first word lines.

In one embodiment, each of the first and second connection lines is formed on the same layer as the first and second word lines. The first and second connection lines may be disposed on both sides of the first and second word lines.

In one embodiment, each of the first and second connection lines is formed on a layer different from the first and second word lines. The first and second connection lines may be disposed on both sides of the first and second word lines or on one side of the first and second word lines.

In one embodiment, the nonvolatile memory device of claim 1 includes: channel semiconductor patterns formed on one sidewall of each of the first and second word line stacks; and a charge storage layer formed between one sidewall of each of the first and second word line stacks and the channel semiconductor patterns. Channel semiconductor patterns formed on one sidewall of the first word line stacks and channel semiconductor patterns formed on one sidewall of the second word line stacks are formed to face each other.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 8A and 8B are cross sectional views of a nonvolatile memory device according to a second embodiment of the present invention, the cross sectional views being taken along the lines I-I' and II-II' of FIG. 7.

FIGS. 16A through 20A and FIGS. 16B through 20B are cross sectional views sequentially illustrating a method of manufacturing a nonvolatile memory device according to embodiments of the present invention.

DETAILED DESCRIPTION OF THE EMBODIMENTS

Figure 1:
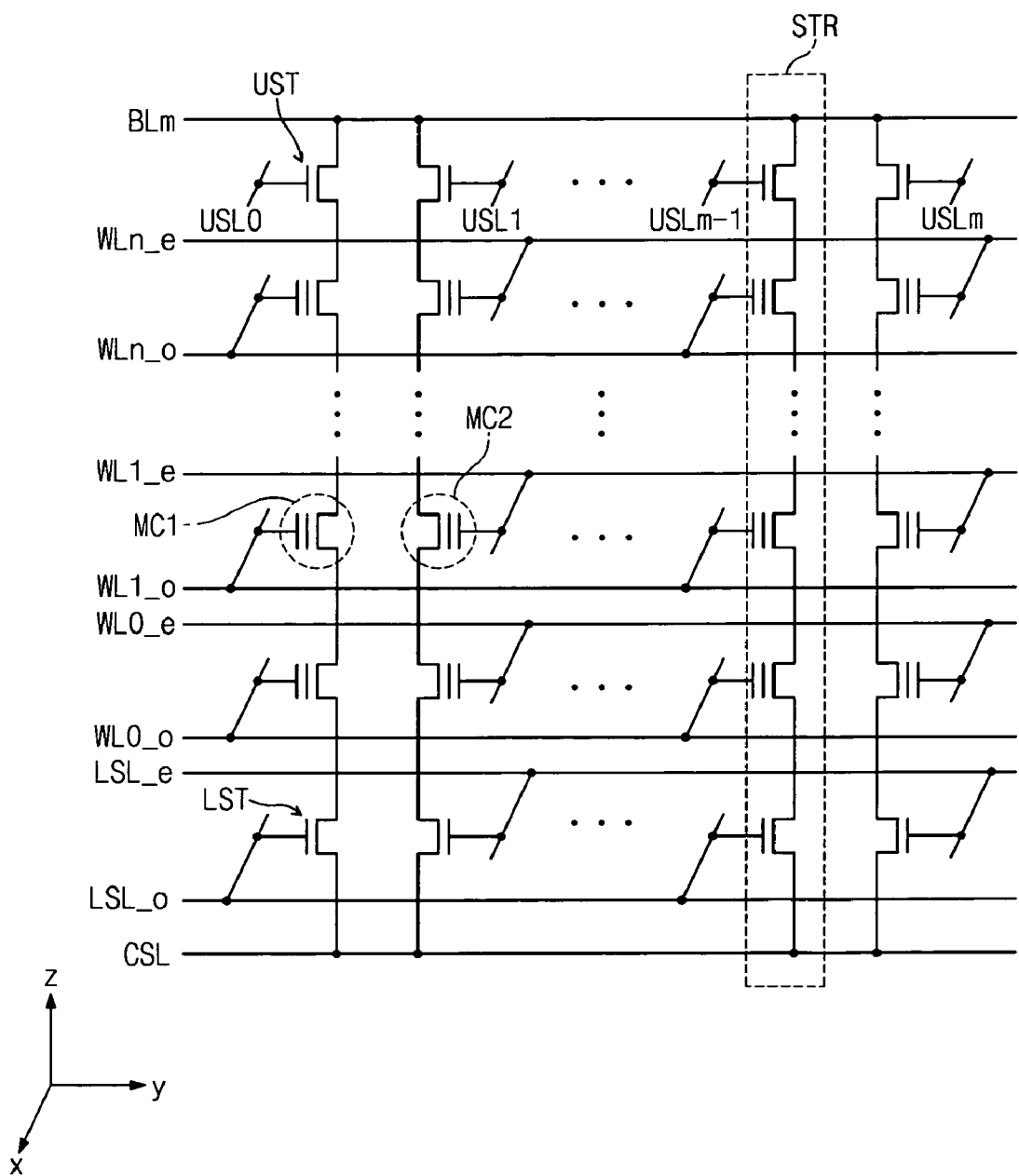
FIG. 1 is a circuit diagram of a nonvolatile memory device according to first, second and third embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1 is a circuit diagram of a nonvolatile memory device according to first, second and third embodiments of the present invention.

Referring to FIG. 1, a nonvolatile memory device according to first through third embodiments of the present invention includes a cell array composed of a plurality of strings STR. The cell array includes a plurality of strings STR between a bit line BLm and a common source line CSL. Each of the strings STR includes upper and lower selection transistors UST, LST, and a plurality of memory cell transistors is serially connected to one another between the upper and lower selection transistors UST, LST. Further, a drain of the upper selection transistor UST is connected to the bit line BLm and a source of the lower selection transistor LST is connected to the common source line CSL. The common source line CSL is a line to which sources of the lower selection transistors LST are connected in common.

The upper selection transistors UST are connected to upper selection lines USL0~USLm respectively. In one embodiment, the lower selection transistors LST may be connected to first or second lower selection lines LSL_o, LSL_e. In another embodiment, the lower selection transistors LST may be connected to lower selection lines respectively as the upper selection lines USL0~USLm. Also, the memory cells may be connected to first word lines WL0_o~WLn_o or second word lines WL0_e~WLn_e respectively.

More specifically, the strings STR have a structure in which the memory cells may be serially connected in a z-axis direction perpendicular to an x-y plane formed by an x-axis direction and a y-axis direction. That is, channels of the selection transistors and the memory transistors may be vertically formed with respect to a surface of a semiconductor substrate.

A nonvolatile memory device may have a three-dimensional structure in which the x-y plane formed by the x-axis and y-axis directions includes 'm' number of memory cells and the x-y plane including 'm' number of memory cells is stacked as 'n' number of layers (here, 'm' and 'n' are natural number).

On each plane (or layer), the memory cells are alternately connected to the first word lines odd word lines; WL0_o~WLn_o and the second word lines even word lines; WL0_e~WLn_e. Thus, different voltages may be applied to adjacent memory cells on the same plane. Like the memory cells, the lower selection transistors LST may also be alternately connected to the first and second lower selection lines LSL_o, LSL_e. Different voltages may be applied to adjacent lower selection lines LSL_o, LSL_e respectively or the same voltage may be applied to adjacent lower selection lines LSL_o, LSL_e.

Referring to FIGS. 1 and 2A through 2D, an operation method of a nonvolatile memory device according to embodiments of the present invention will be described. A program operation and a read operation of a second memory cell MC2 connected to a second word line WL1_e is described. A first memory cell MC1 is a nonselected memory cell and is disposed to be adjacent to the selected memory cell MC2. The first memory cell MC1 is also disposed on the same layer as the selected memory cell MC2.

Figure 2A:
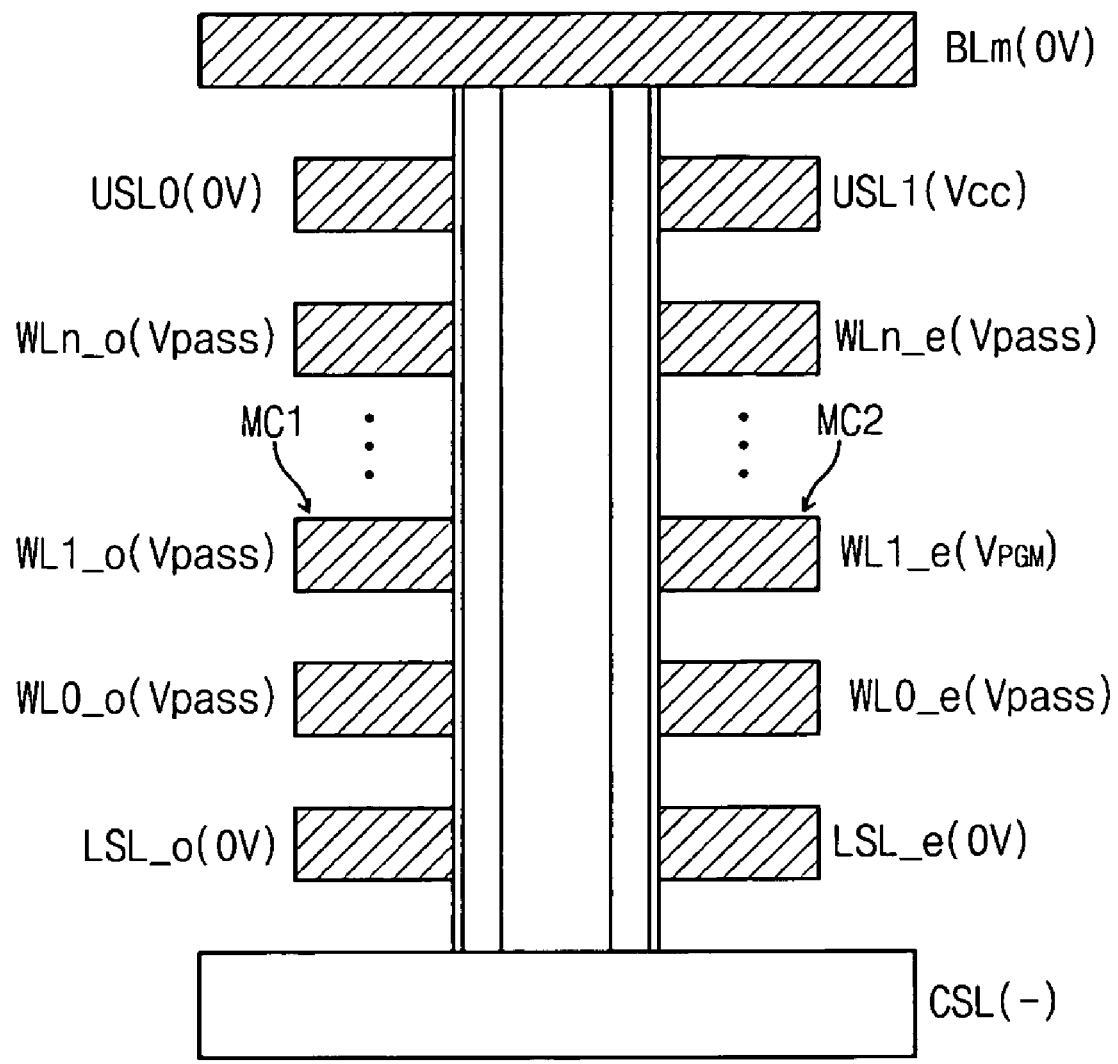
FIGS. 2A through 2D are cross sectional views illustrating operation of a nonvolatile memory device according to embodiments of the present invention.
Figure 2B:
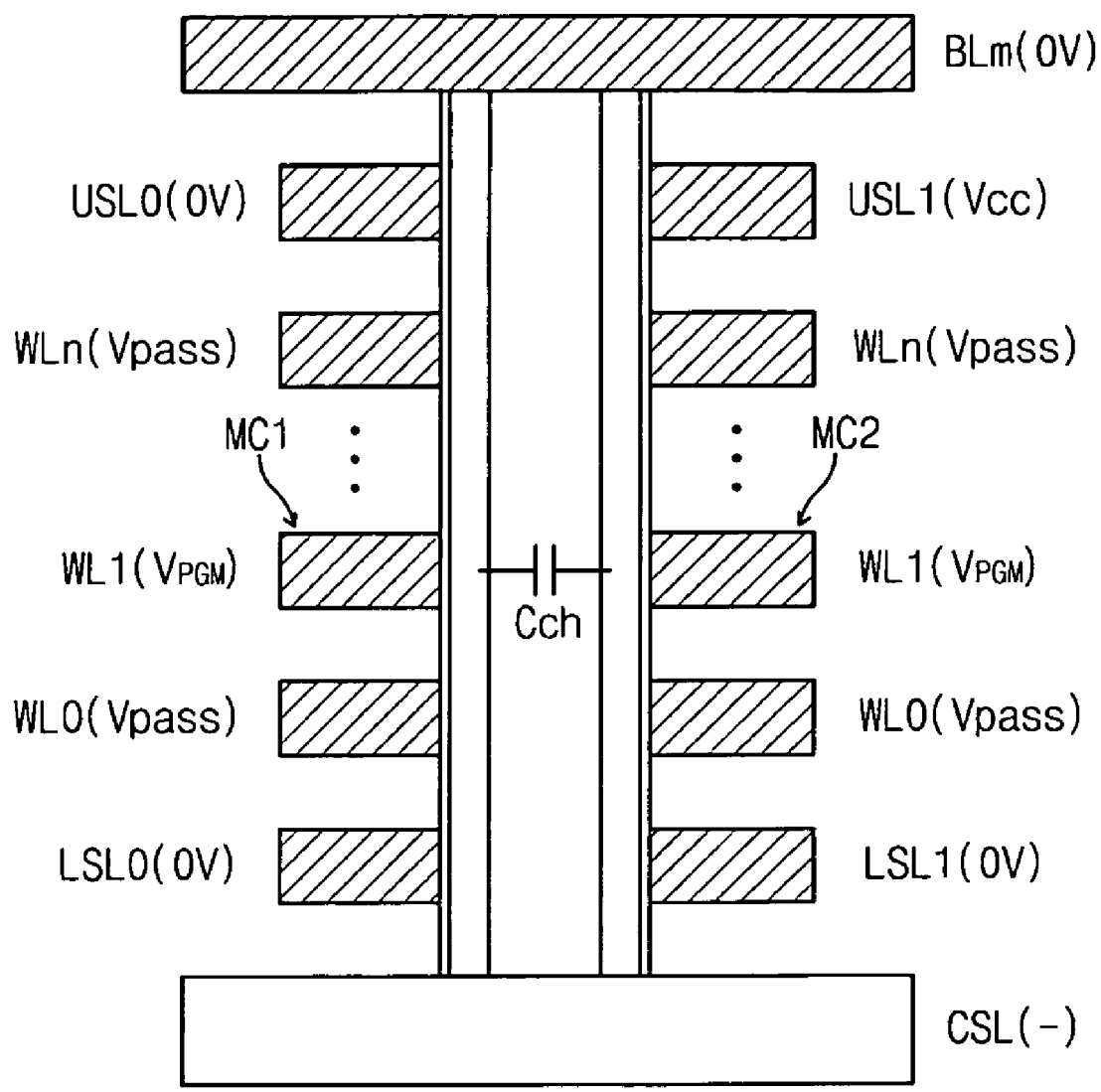
Figure 2C:
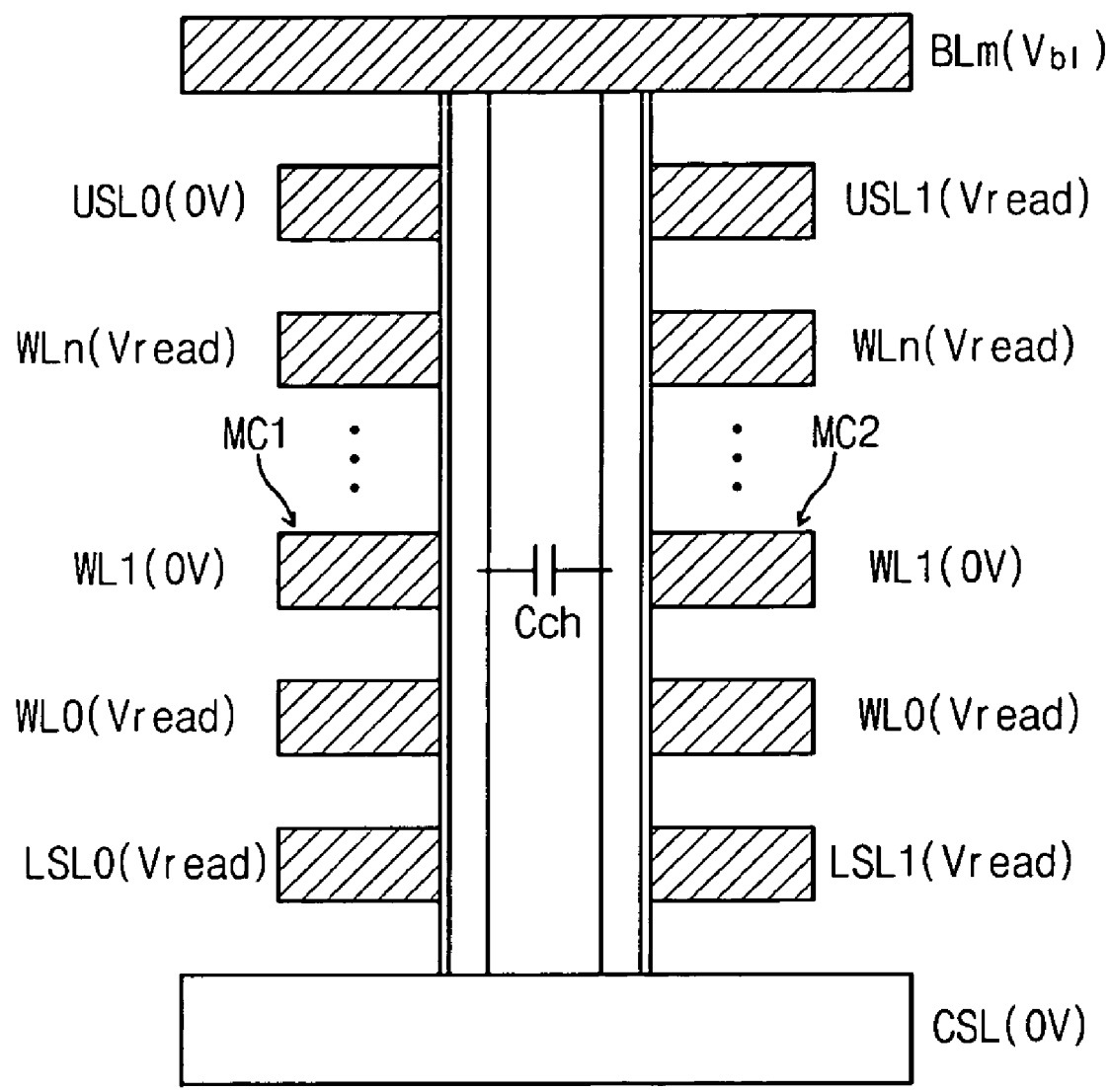

FIGS. 2A through 2D are cross sectional views illustrating an operation of a nonvolatile memory device of a three-dimensional structure according to embodiments of the present invention. FIGS. 2A and 2C are cross sectional views illustrating an operation of a nonvolatile memory device of a three-dimensional structure as comparative examples for comparison with embodiments of the present invention First, referring to FIGS. 2A and 2B, a program operation is described.

Referring to FIG. 2A, when a program operation is performed, the same voltage may be applied to word lines disposed on the same layer and different voltages may be applied to word lines disposed on different layers.

For program operation, a program voltage $V_{PGM}$ is applied to word lines WL1 of a layer including the selected memory cell MC2 and a pass voltage $V_{PASS}$ is applied to word lines on a nonselected layer. Here, the program voltage $V_{PGM}$ is about 10~20V and the pass voltage $V_{PASS}$ is a voltage that can turn on memory cells. Also, 0V is applied to a bit line BLm connected to the selected memory cell MC2 and Vcc is applied to the other bit lines. 0V is applied to lower selection lines LSL0, LSL1, thereby turning off all of lower selection transistors. Vcc is applied to a selected upper selection line USL1 and 0V is applied to an unselected upper selection line USL0.

In a string including the selected memory cell MC2, a selected upper selection transistor and unselected memory cells may be turned on. Accordingly, a channel of the selected memory cell MC2 has the same electric potential i.e., 0V, as the selected bit line BLm. At this time, since the program voltage $V_{PGM}$ having a high voltage level may be applied to the selected memory cell MC2, an F-N tunneling phenomenon occurs, thereby programming the selected memory cell MC2.

When the selected memory cell MC2 is programmed, a threshold voltage of the selected memory cell MC2 changes to a higher level, but threshold voltages of the nonselected memory cells should not be changed. To that end, as described above, 0V is applied to the unselected upper selection line USL0. As a result, channels of memory cells connected to the nonselected upper selection line USL0 are not connected to the bit line BLm and the common source line CSL to be floated.

However, as integration of a memory device is increased, a space between memory cells is decreased and, more specifically, a space between channels is decreased in the case of a three-dimensional nonvolatile memory device. Thus, a channel coupling capacitance Cch may be increased between the selected memory cell MC2 and the nonselected memory cell MC1. An increase of the channel coupling capacitance Cch may reduce a channel voltage of the unselected memory cell MC1 disposed on the same layer as the selected memory cell MC2 and adjacent to the selected memory cell MC2. A program voltage $V_{PGM}$ is applied to a word line WL1 of the nonselected memory cell MC1 disposed on the same layer as the selected memory cell MC2. Thus, a large potential difference may be generated between a channel and the word line WL1 of the nonselected memory cell MC1, so that the nonselected memory cell may be programmed. That is, in a three-dimensional nonvolatile memory device, when the same voltage is applied to word lines disposed on the same layer, the nonselected memory cell CM1 may be programmed due to a channel coupling capacitance Cch.

According to embodiments of the present invention, word lines may be divided into a first word line WLn_o and a second word line WLn_e at each of the layers. Thus, different voltages may be applied to the first and second word lines WLn_o, WLn_e. The separation of the word lines may prevent an unwanted program due to the channel coupling capacitance described above.

Describing in detail referring to FIG. 2B, a program voltage $V_{PGM}$ is applied to a second word line WL1_e connected to the selected memory cell MC2 and a pass voltage $V_{PASS}$ may be applied to the first and second word lines WLn_o, WLn_e connected to nonselected memory cells.

Also, 0V is applied to the selected bit line BLm and Vcc is applied to the other bit lines. 0V is applied to the unselected upper selection line USL0 and the lower selection lines LSL_o, LSL_e LSL0, LSL1, and Vcc is applied to the selected upper selection line USL1.

As a result, the selected memory cell MC2 is programmed, and channels of memory cells connected to the nonselected upper selection line USL0 are not connected to the bit line BLm and the common source line CSL to be floated.

Here, since a pass voltage Vpass is applied to a first word line WL1_o connected to the nonselected memory cell MC1 disposed on the same layer as the selected memory cell MC2 and adjacent to the selected memory cell MC2, a generation of a large potential difference by which charge can be F-N tunneled may be prevented even though a channel voltage of the nonselected memory cell MC1 is lowered due to a channel coupling capacitance. Therefore, the nonselected memory cell MC1 adjacent to the selected memory cell MC2 may be prevented from being programmed by a channel coupling capacitance. In another embodiment, since a voltage applied to the first word line WL1_o is to reduce a potential difference between a word line and a channel, a voltage lower than the program voltage $V_{PGM}$ may be applied.

Figure 2D:
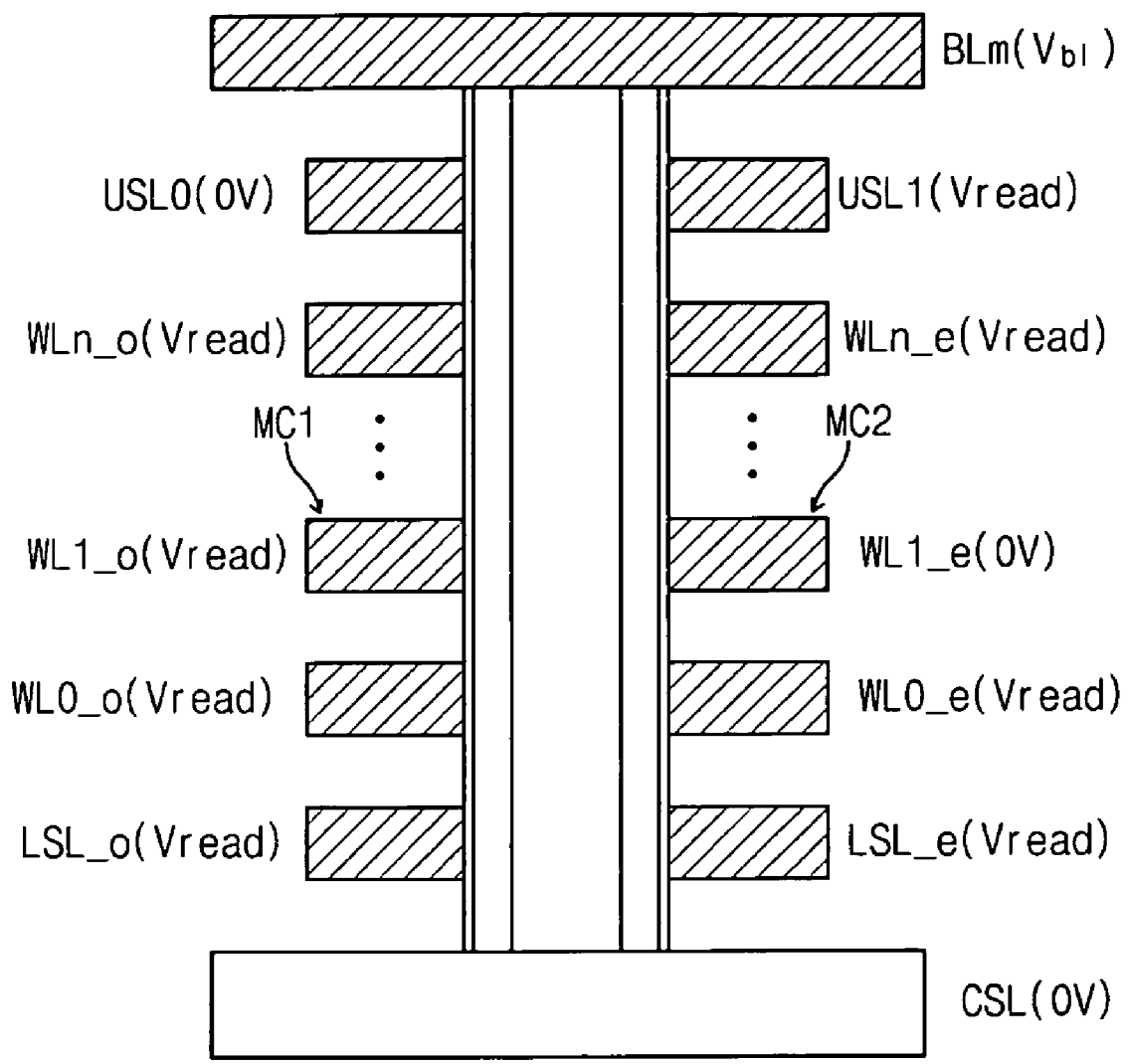

Referring to FIGS. 2C and 2D, a read operation is described.

Referring to FIG. 2C, when a read operation is performed, the same voltage may be applied to word lines disposed on the same layer and different voltages may be applied to word lines disposed on different layers by the same method as the embodiment described referring to FIG. 2A.

For a read operation, 0V is applied to the word line WL1 connected to the selected memory cell MC2 and a read voltage Vread is applied to word lines WL0, WL2~WLn connected to nonselected memory cells disposed on different layers. Here, the read voltage Vread is a voltage that can turn on the nonselected memory cells.

A bit line voltage Vbl of about 0.4~0.9V is applied to the selected bit line BLm and 0V is applied to the other bit lines. 0V is applied to the common source line CSL and the read voltage Vread is applied to the lower selection lines LSL0, LSL1, so that a channel of the selected memory cell MC2 can be connected to the common source line CSL. Also, the read voltage Vread is applied to the selected upper selection line USL1 and 0V is applied to the nonselected upper selection line USL0.

If the selected memory cell MC2 is an erased memory cell in which data is not stored, the selected memory cell MC2 may have a low threshold voltage. As a result, even when 0V is applied to the word line WL1 of the selected memory cell MC2, the selected memory cell MC2 may be turned on. If the selected memory cell MC2 is turned on, a current flow may be generated in the string and a change of a current flowing in the string may be detected through the selected bit line BLm.

0V is applied to the nonselected upper selection line USL0 on a string connected to the selected bit line BLm and not including the selected memory cell MC2, thereby cutting channels of memory cells off from the selected bit line BLm. In the string not including the selected memory cell MC2, if the memory cell MC1 disposed on the same layer as the selected memory cell MC2 and adjacent to the selected memory cell MC2 is a programmed memory cell, the memory cell MC1 is turned off even though 0V is applied to the word line WL1 because the memory cell MC1 has a high threshold voltage. Therefore, the voltage of the common source line CSL does not transfer to a channel of the memory cell MC1.

Also, a high threshold voltage of the programmed memory cell MC1 disposed on the same layer as the selected memory cell MC2 and adjacent to the selected memory cell MC2 may change a channel voltage of the selected memory cell MC2 by a channel coupling capacitance. As a result, when reading the selected memory cell an erased memory cell MC2, a read error may occur in the selected memory cell MC2.

That is, in a three-dimensional nonvolatile memory device, when the same voltage is applied to word lines disposed on the same layer, a threshold voltage of the selected memory cell MC2 is changed by a channel coupling capacitance, so that a read error may occur. Accordingly, in embodiments of the present invention, first and second word lines WL0_o~WLn_o, WL0_e~WLn_e are provided to each layer and different voltages may be applied to the first and second word lines WL0_o~WLn_o, WL0_e~WLn_e.

Referring to FIG. 2D, 0V is applied to a second word line WL1_e connected to the selected memory cell MC2 and a read voltage Vread is applied to first and second word lines WL0_o~WLn_o, WL0_e~WL2_e~WLn_e connected to nonselected memory cells.

Further, a bit line voltage Vbl of about 0.4~0.9V is applied to the selected bit line BLm and 0V is applied to the other bit lines. 0V is applied to the common source line CSL and the read voltage Vread is applied to the lower selection lines LSL_o, LSL_e, so that a channel of the memory cells can be connected to the common source line CSL. Also, the read voltage Vread is applied to the selected upper selection line USL1 and 0V is applied to the nonselected upper selection line USL0.

Since a current flow is generated in a string including the selected memory cell (an erased memory cell MC2), a current change can be detected through the selected bit line BLm.

Further, if the adjacent memory cell MC1 adjacent to the selected memory cell MC2 is programmed in a string connected to the selected bit line BLm and not including the selected memory cell, a read voltage Vread is applied to the first word line WL1_o connected to the memory cell MC1, thereby turning on the memory cell MC1. Therefore, a voltage 0V of the common source line CSL may transfer to channels of memory cells in a nonselected string. That is, channel voltages of memory cells of a nonselected string can be maintained as 0V. Thus, when a read operation is performed, it is possible to prevent a change of a threshold voltage of the selected memory cell MC2 by the channel coupling capacitance.

Here, a voltage applied to the first word line WL1_o is not limited to the read voltage Vread and all the voltages that can turn on the programmed memory cell MC1 are possible.

In the embodiments of the present invention, when a read operation and a program operation are performed, different voltages may be applied to word lines of memory cells adjacent to one another disposed on the same layer. Thus, an error of a read operation and a program operation by a channel coupling capacitance generated between channels of adjacent memory cells may be prevented.

Hereinafter, referring to FIGS. 3, 4A, 4B, 5A and 5B, a nonvolatile memory device according to a first embodiment of the present invention is described.

Figure 3:
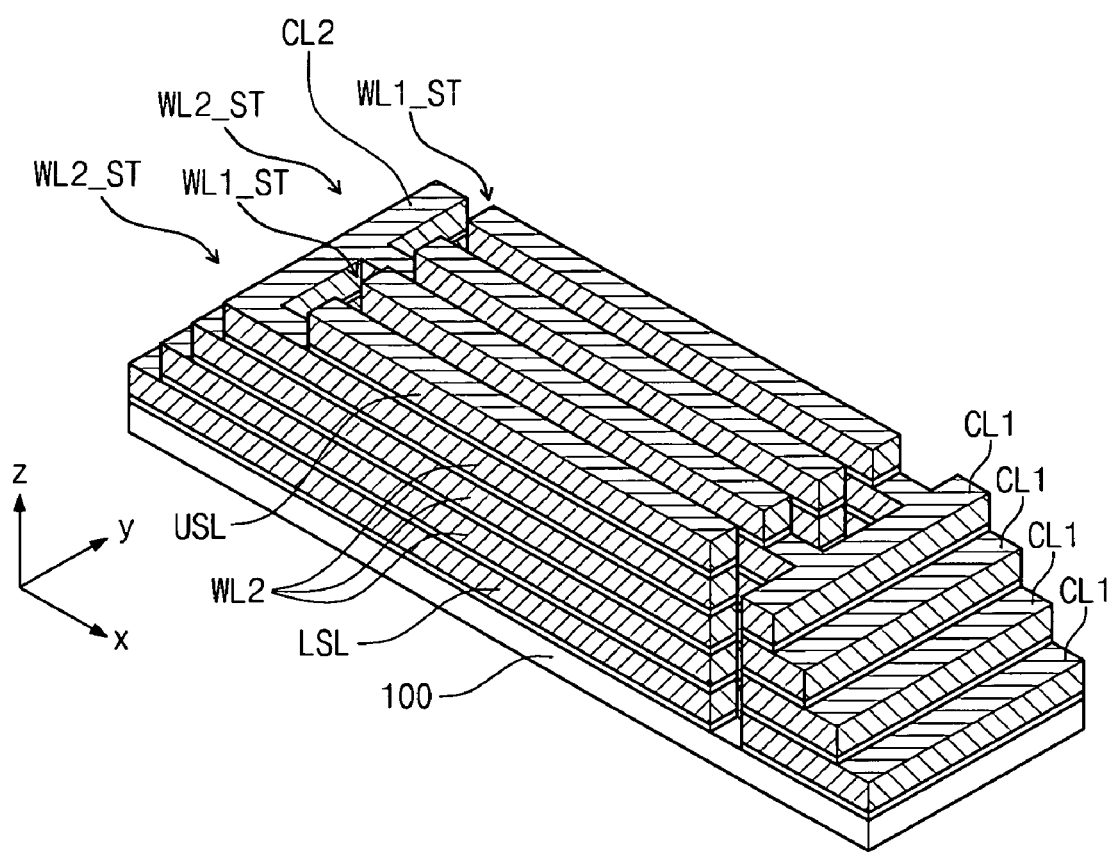
FIG. 3 is a perspective view of a nonvolatile memory device according to a first embodiment of the present invention.
Figure 4A:
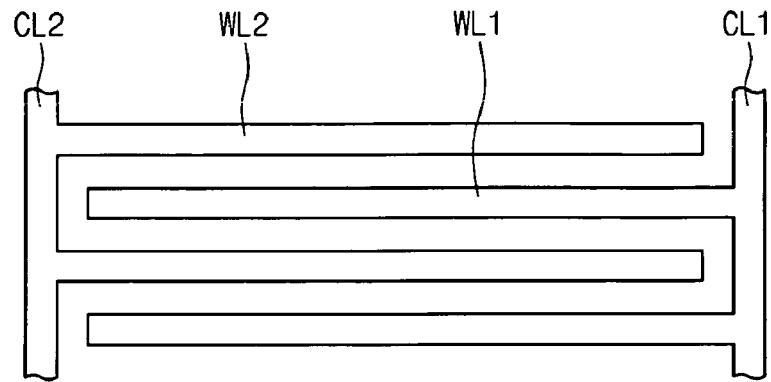
FIGS. 4A and 4B are top plan views of a nonvolatile memory device according to a first embodiment of the present invention.
Figure 4B:
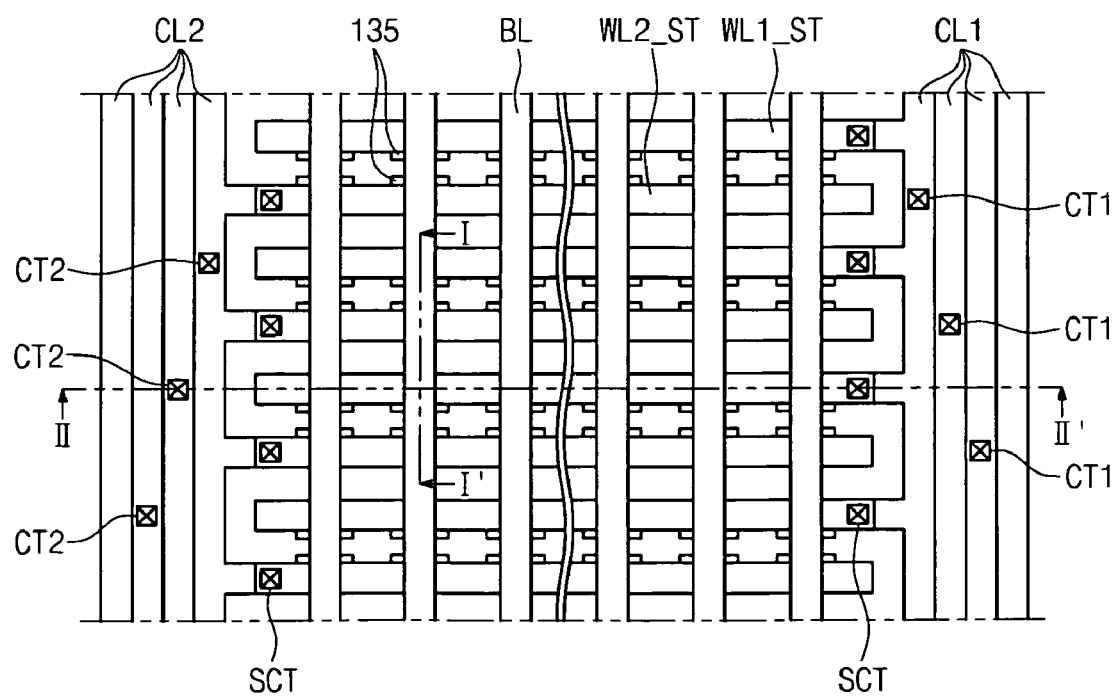
Figure 5A:
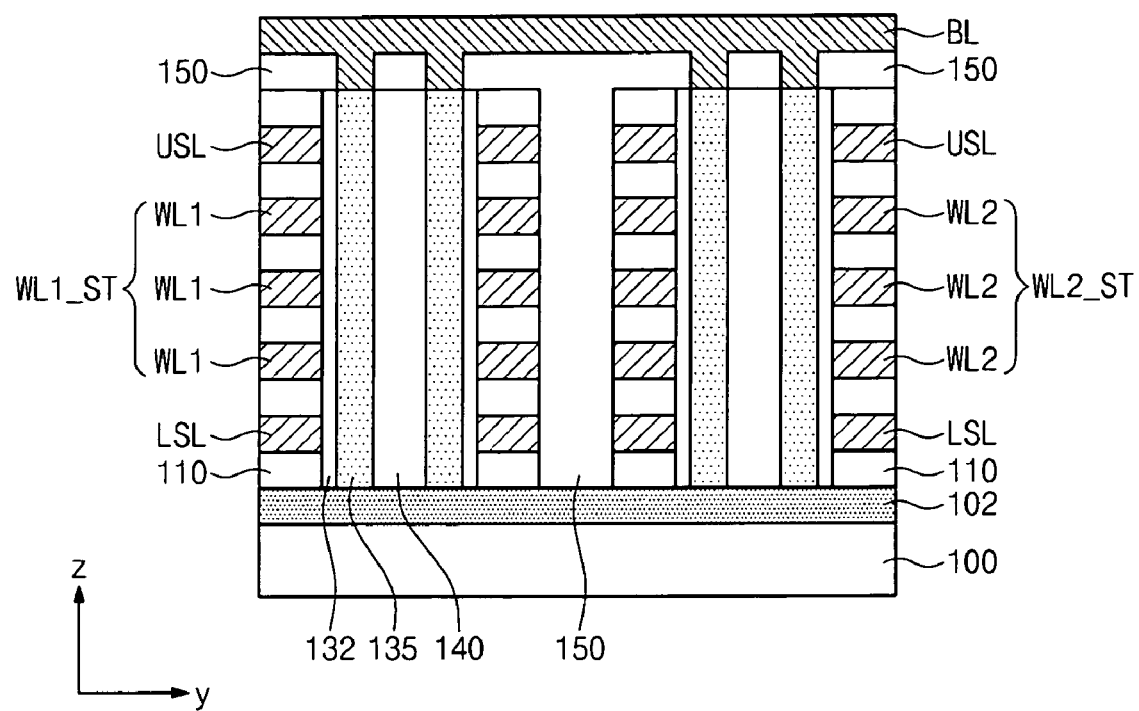
FIGS. 5A and 5B are cross sectional views of a nonvolatile memory device according to a first embodiment of the present invention, the cross sectional views being taken along the lines I-I' and II-II' of FIG. 4B.
Figure 5B:
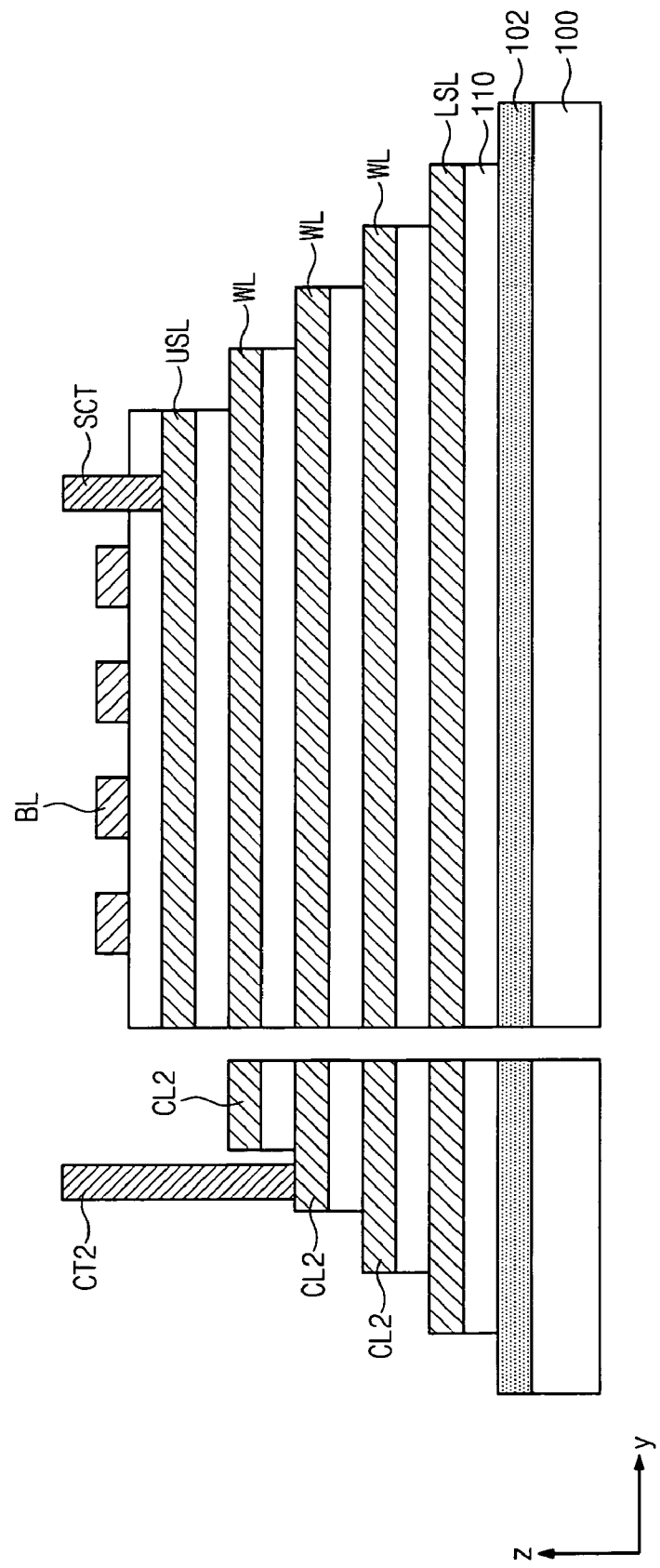

FIG. 3 is a perspective view of a nonvolatile memory device according to an embodiment of the present invention. FIGS. 4A and 4B are top plan views of a nonvolatile memory device according to a first embodiment of the present invention. FIGS. 5A and 5B are cross sectional views of a nonvolatile memory device according to a first embodiment of the present invention, the cross sectional views being taken along the lines I-I' and respectively, of FIG. 4B. In FIG. 4B, upper selection lines USL stacked on word line stacks WL1_ST, WL2_ST respectively are not depicted and only contact plugs SCT connected to the upper selection USL are depicted.

Referring to FIGS. 3 and 4A, an arrangement structure of word lines disposed on one layer is described in detail.

First and second word lines WL1, WL2 extending in an x-axis direction on an identical plane are disposed. The first word lines WL1 are disposed to be spaced a predetermined distance apart from one another and in parallel with one another. The second word lines WL2 are disposed between the first word lines WL1. That is, the first and second word lines WL1, WL2 extending in the x-axis direction are alternately arranged in a y-axis direction. First ends of the first word lines WL1 are commonly connected to a first connection line CL1 extending in the y-axis direction. The first connection line CL1 is formed of the same conductive layer as the first and second word lines WL1, WL2. Also, first ends of the second word lines WL2 are commonly connected to a second connection line CL2 extending in the y-axis direction. The second connection line CL2 may also be formed on the same layer as the first and second word lines WL1, WL2.

The second connection line CL2 is formed to be symmetrical to the first connection line CL1 with respect to the first and second word lines WL1, WL2 between the first and second connection lines CL1, CL2. Accordingly, the first word lines WL1 are spaced apart from the second connection line CL2 and the second word lines WL2 are spaced apart from the first connection line CL1. A plurality of the first and second word lines WL1, WL2 and the first and second connection lines CL1, CL2 having the plane structure described above is stacked as depicted in FIG. 3. Interlayer insulating layers 110 are interposed between the stacked first and second word lines WL1, WL2 and between the stacked first and second connection lines CL1, CL2.

Referring to FIGS. 4B, 5A and 5B, lower selection lines LSL extending in the x-axis direction are disposed in parallel to one another along the y-axis direction on a semiconductor substrate 100. An impurity region or well 102 provided as a common source line CSL of FIG. 1 is formed in the semiconductor substrate 100.

A first word line stack WL1_ST or a second word line stack WL2_ST is disposed on each of the lower selection lines LSL. The first word line stack WL1_ST is such that the first word lines WL1 are stacked along a z-axis direction and the second word line stack WL2_ST is such that the second word lines WL2 are stacked along a z-axis direction. The interlayer insulating layer 110 is interposed between the first word lines or between the second word lines. An upper selection line USL is formed on the first and second word line stacks WL1_ST, WL2_ST.

The first and second word line stacks WL1_ST, WL2_ST are identical to an arrangement structure of the first and second word lines WL1, WL2 disposed on the same layer. That is, the first and second word line stacks WL1_ST, WL2_ST are alternately arranged along the y-axis direction.

Also, the first connection line CL1 and the second connection line CL2 are formed on each layer. The first connection layer CL1 of each layer is connected to the first word line WL1 disposed on the same layer and the second connection layer CL1 of each layer is also connected to the second word line WL2 disposed on the same layer. The first and second connection lines CL1, CL2 disposed at both sides of the first and second word lines WL1, WL2 may be stacked to have a stair shape to form contact plugs.

A charge storage pattern 132 and a channel semiconductor pattern 135 are formed on one side of the stacked lower selection line LSL, the first and second word line stacks WL1_ST, WL2_ST and the upper selection line USL. The channel semiconductor patterns 135 are formed on any one side of both sides of the first word line stack WL1_ST or the second word line stack WL2_ST. The channel semiconductor patterns 135 are formed to face each other.

The channel semiconductor patterns 135 may extend to one sidewall of the upper selection line USL from a top surface of the semiconductor substrate and may be formed on one sidewall of the first and second word line stacks WL1_ST, WL2_ST. The channel semiconductor patterns 135 are spaced a predetermined distance apart from each other. The charge storage pattern 132 is disposed between the first word line stack WL1_ST and the channel semiconductor pattern 135 or between the second word line stack WL2_ST and the channel semiconductor pattern 135. The charge storage pattern 132 may be formed to have the same arrangement structure as the channel semiconductor pattern 135 or may be formed on an entire portion of one sidewall of the first and second word line stacks WL1_ST, WL2_ST. In the embodiments of the present invention, the charge storage pattern 132 may include a trap insulating layer (e.g., a silicon nitride layer) or a floating gate electrode.

Contact plugs CT1, CT2 for applying a predetermined voltage may be formed on the first and second connection lines CL1, CL2 disposed on each of layers. Contact plugs SCT are formed on each of the upper selection lines USL. The contact plugs SCT formed on the upper selection lines USL may be disposed on one edge or on both edges of the upper selection line USL depending on a process margin of an interconnection.

The lower selection lines LSL may also be alternatively connected to the first and second connection lines CL1, CL2 disposed on the same layer as the lower selection lines LSL like the first and second word lines WL1, WL2.

Figure 6:
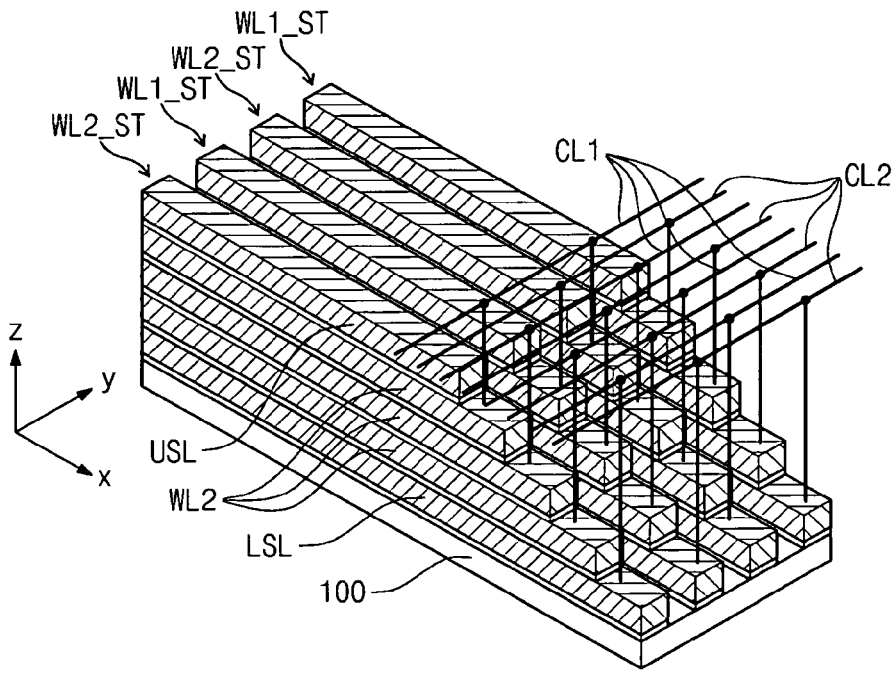
FIG. 6 is a perspective view of a nonvolatile memory device according to a second embodiment of the present invention.
Figure 7:
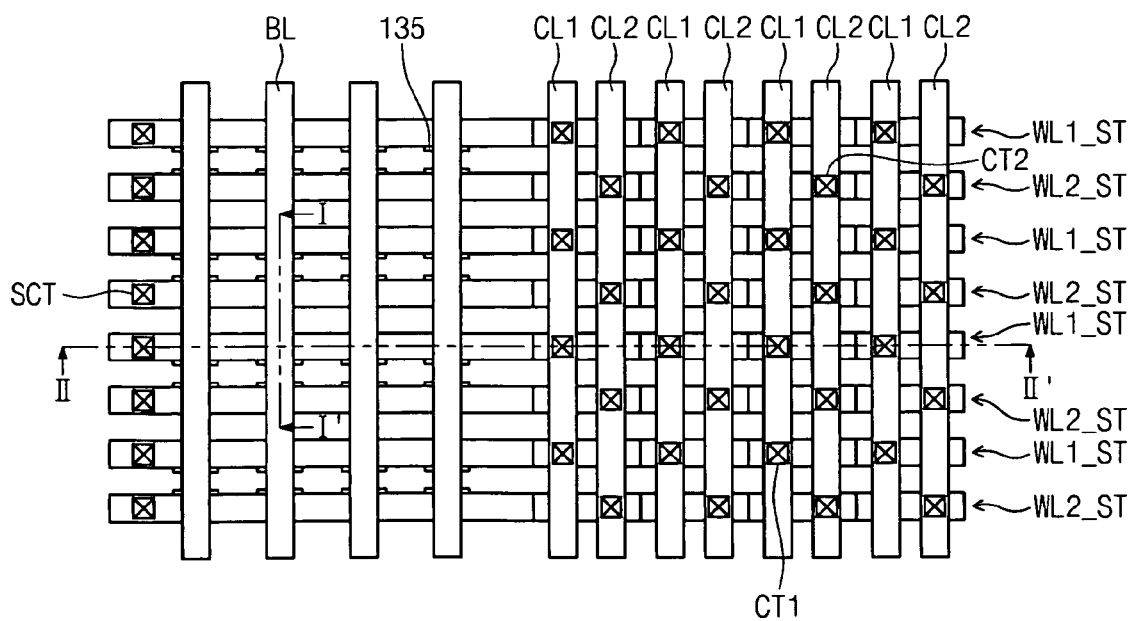
FIG. 7 is a top plan view of a nonvolatile memory device according to a second embodiment of the present invention.
Figure 8A:
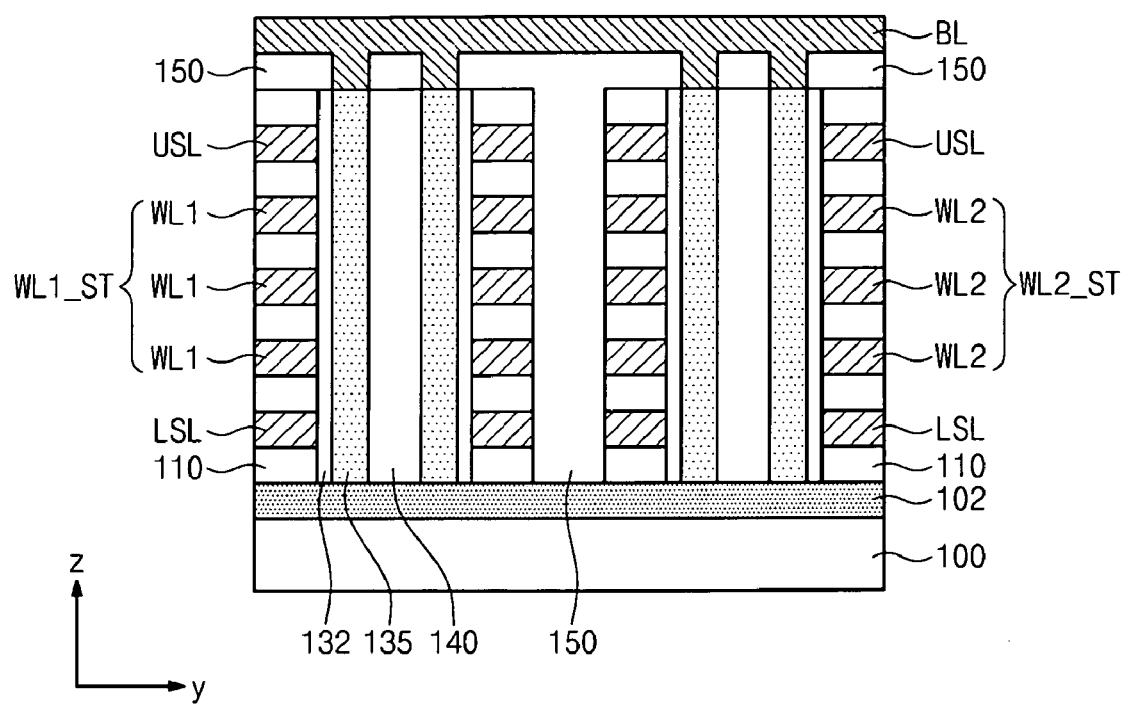

Referring to FIGS. 6, 7, 8A and 8B, a nonvolatile memory device according to a second embodiment is described in detail. FIG. 6 is a perspective view of a nonvolatile memory device according to a second embodiment of the present invention. FIG. 7 is a top plan view of a nonvolatile memory device according to a second embodiment of the present invention. FIGS. 8A and 8B are cross sectional views of a nonvolatile memory device according to a second embodiment of the present invention, the cross sectional views being taken along the lines I-I' and respectively, of FIG. 7.

Referring to FIGS. 6, 7, 8A and 8B, like the first embodiment, first and second word lines WL1, WL2 extending in an x-axis direction are alternately disposed. The laminated first word lines WL1 form first word line stacks WL1_ST and the laminated second word lines WL2 form second word line stacks WL2_ST.

In the first and second word line stacks WL1_ST, WL2_ST, the first and second word lines WL1, WL2 have gradually decreasing lengths as the first and second word lines WL1, WL2 are stacked. That is, one end portion of the laminated first and second word lines WL1, WL2 may have a stair shape and another end portion of the laminated first and second word lines WL1, WL2 may be aligned with one another.

Charge storage patterns 132 and channel semiconductor patterns 135 may be formed on one sidewall of the first and second word line stacks WL1_ST, WL2_ST. The charge storage patterns 132 and the channel semiconductor patterns 135 formed on one sidewall of the first and second word line stacks WL1_ST, WL2_ST may be formed to face each other. That is, the charge storage patterns 132 and the channel semiconductor patterns 135 may be formed on one sidewall of the first word line stack WL1_ST and on the other sidewall of the second word line stack WL2_ST.

The charge storage patterns 132 and the channel semiconductor patterns 135 may have a line shape extending in a z-axis direction and may be spaced a predetermined distance apart from the one sidewall of the first and second word line stacks WL1_ST, WL2_ST.

In the first and second word line stacks WL1_ST, WL2_ST, contact plugs CT1, CT2 for word lines formed on one end portion of first and second word lines WL1, WL2. The contact plugs CT1, CT2 for word lines may be disposed in zigzags on a plane located at the same layer.

The contact plugs CT1 for the first word line WL1 disposed on the same layer may be connected to one first connection line CL1 and the contact plugs CT2 for the first word line WL2 disposed on the same layer may be connected to one first connection line CL2. The first and second connection lines CL1, CL2 extend in a y-axis direction to connect the first and second word lines WL1, WL2 extending in the x-axis direction respectively. The first and second connection lines CL1, CL2 are disposed on the first and second word line stacks WL1_ST, WL2_ST.

Also, since the first and second connection lines CL1, CL2 are formed on one end portion of the first and second word line stacks WL1_ST, WL2_ST, contact plugs SCT connected to upper selection lines USL may be formed on another end portion of the first and second word line stacks WL1_ST, WL2_ST at which sidewalls of the word lines WL are aligned with one another.

Referring to FIGS. 9, 10, 11A and 11B, a nonvolatile memory device according to a third embodiment is described in detail. The description of common features already discussed in the first and second embodiments is not repeated and different features are described in detail.

Figure 9:
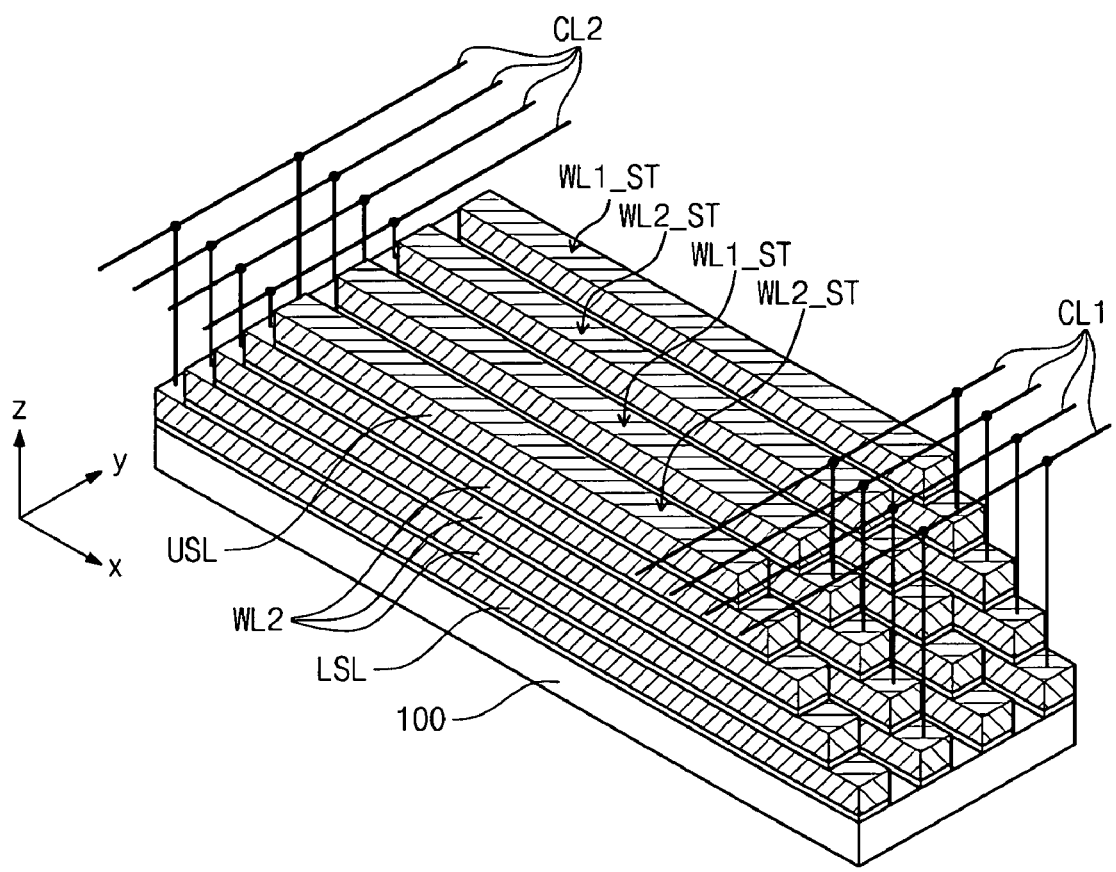
FIG. 9 is a perspective view of a nonvolatile memory device according to a third embodiment of the present invention.
Figure 10:
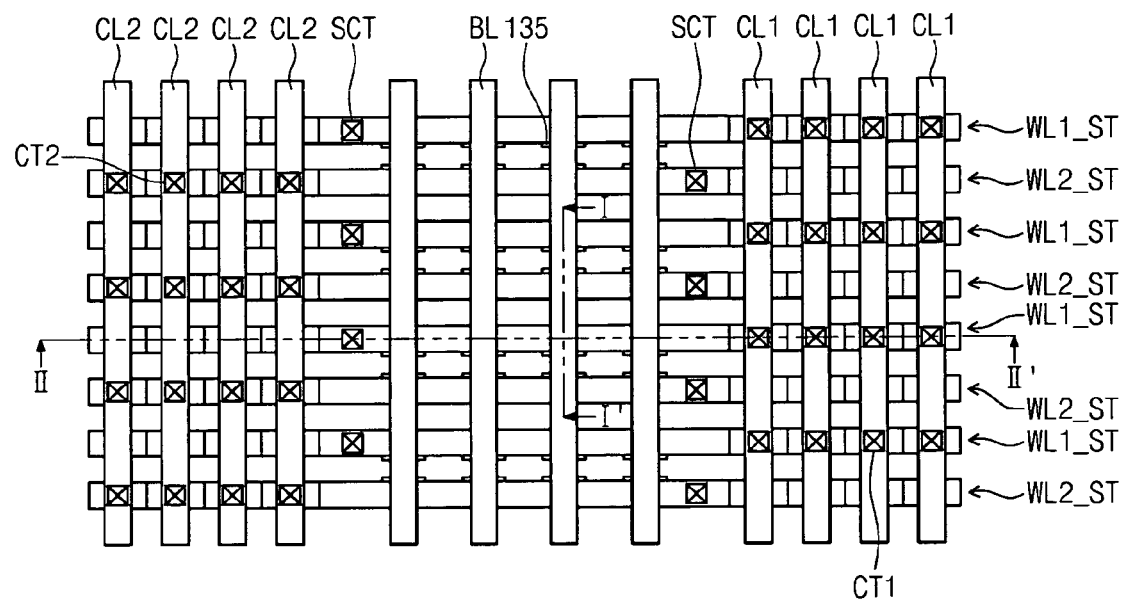
FIG. 10 is a top plan view of a nonvolatile memory device according to a third embodiment of the present invention.
Figure 11A:
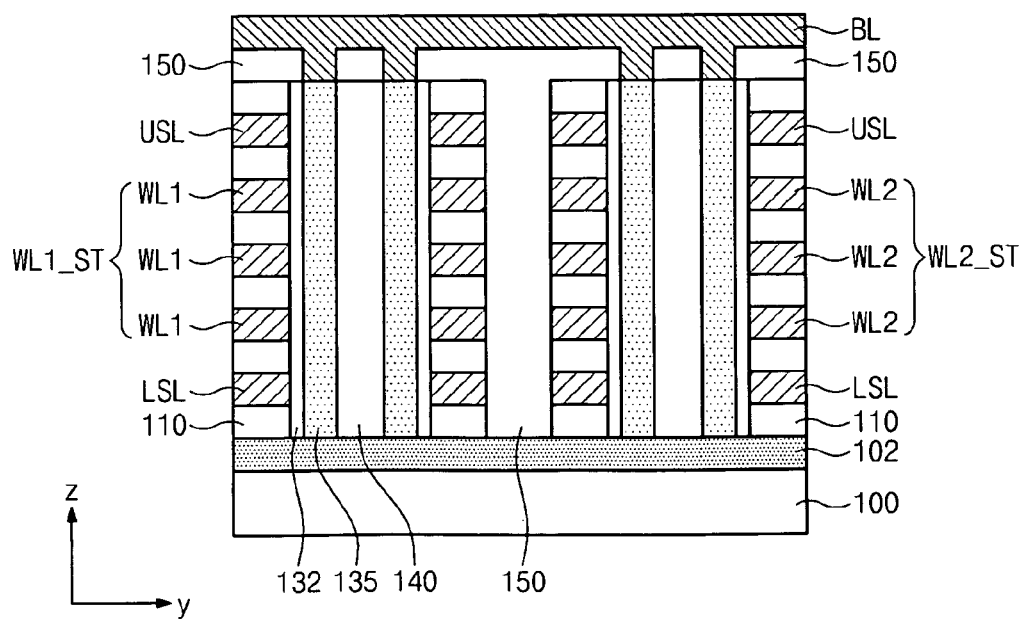
FIGS. 11A and 11B are cross sectional views of a nonvolatile memory device according to a third embodiment of the present invention, the cross sectional views being taken along the lines I-I' and II-II' of FIG. 10.
Figure 11B:
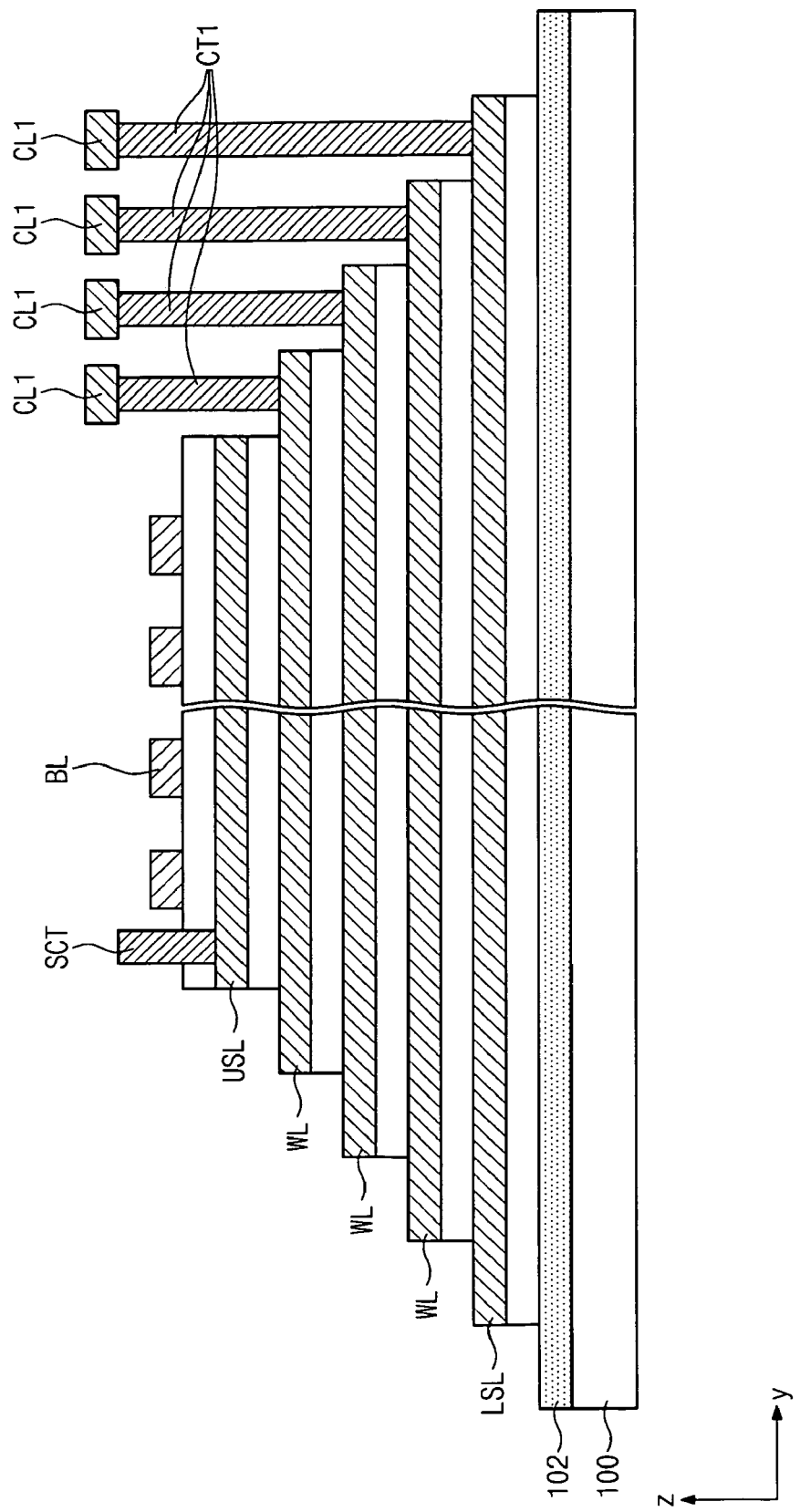

FIG. 9 is a perspective view of a nonvolatile memory device according to a third embodiment of the present invention. FIG. 10 is a top plan view of a nonvolatile memory device according to a third embodiment of the present invention. FIGS. 11A and 11B are cross sectional views of a nonvolatile memory device according to a third embodiment of the present invention, the cross sectional views being taken along the lines I-I' and II-II', respectively, of FIG. 10.

Referring to FIGS. 9, 10, 11A and 11B, unlike the second embodiment, first and second word lines WL1, WL2 are stacked so that both side portions of first and second word line stacks WL1_ST, WL2_ST have a stair shape. The first and second word line stacks WL1_ST, WL2_ST are parallel to one another and are alternately disposed in a y-axis direction.

In the first word line stacks WL1_ST, contact plugs CT1 for the first word line WL1 are formed on one end portion of first word lines WL1 of each layer and a first connection line CT1 is formed on the contact plugs CT1 for the first word line WL1 disposed on the same layer. In the second word line stacks WL2_ST, contact plugs CT2 for the second word line WL2 are formed on the other end portion of second word lines WL2 of each layer and a second connection line CT2 is formed on the contact plugs CT2 for the second word line WL2 disposed on the same layer.

Therefore, the first word lines WL1 on each layer are connected to one another through the first connection line CL1 and the second word lines WL2 on each layer are also connected to one another through the second connection line CL2. Also, the first connection lines CL1 corresponding to each layer and the second connection lines CL2 corresponding to each layer are symmetrically disposed with respect to the first and second word line stacks WL1_ST, WL2_ST.

Figure 12:
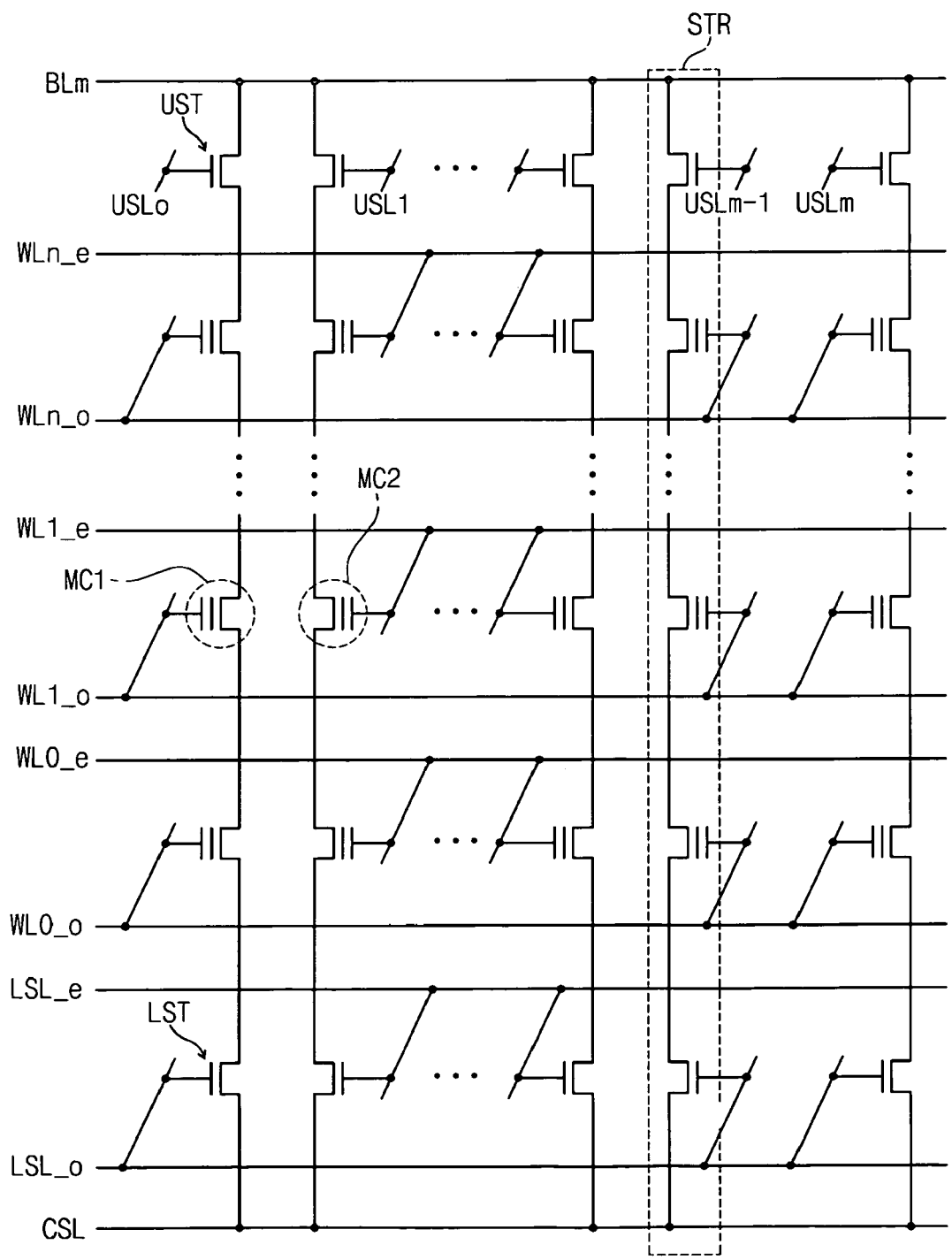
FIG. 12 is a circuit diagram of a nonvolatile memory device according to fourth, fifth and sixth embodiments of the present invention.

Referring to FIG. 12, nonvolatile memory devices according to fourth, fifth and sixth embodiments are described. FIG. 12 is a circuit diagram of a nonvolatile memory device according to fourth, fifth and sixth embodiments of the present invention. Since FIG. 12 is similar to the circuit of FIG. 1, features different from the circuit of FIG. 1 are described in detail, but description of features described above is not repeated.

Referring to FIG. 12, in a nonvolatile memory device having a three-dimensional structure, a number 'm' of memory cells are formed on an x-y plane formed by x-axis and y-axis directions and the x-y plane including 'm' memory cells is stacked as a number 'n' of layers (here, 'm' and 'n' are natural number).

On each plane, the memory cells make a pair and the pair of memory cells are alternately connected to the first word lines (odd word lines; WL0_o WLn_o) and the second word lines (even word lines; WL0_e~WLn_e) two at a time. On the same layer, channels of the memory cells connected to the same word line and adjacent to each other do not face each other. Thus, different voltages may be applied to memory cells connected to the same word line and adjacent to each other on the same plane.

Lower selection transistors LST are also alternately connected to first and second selection lines LSL_o, LSL_e two at a time like the first and second word lines WL0_o, WL0_e.

Figure 13A:
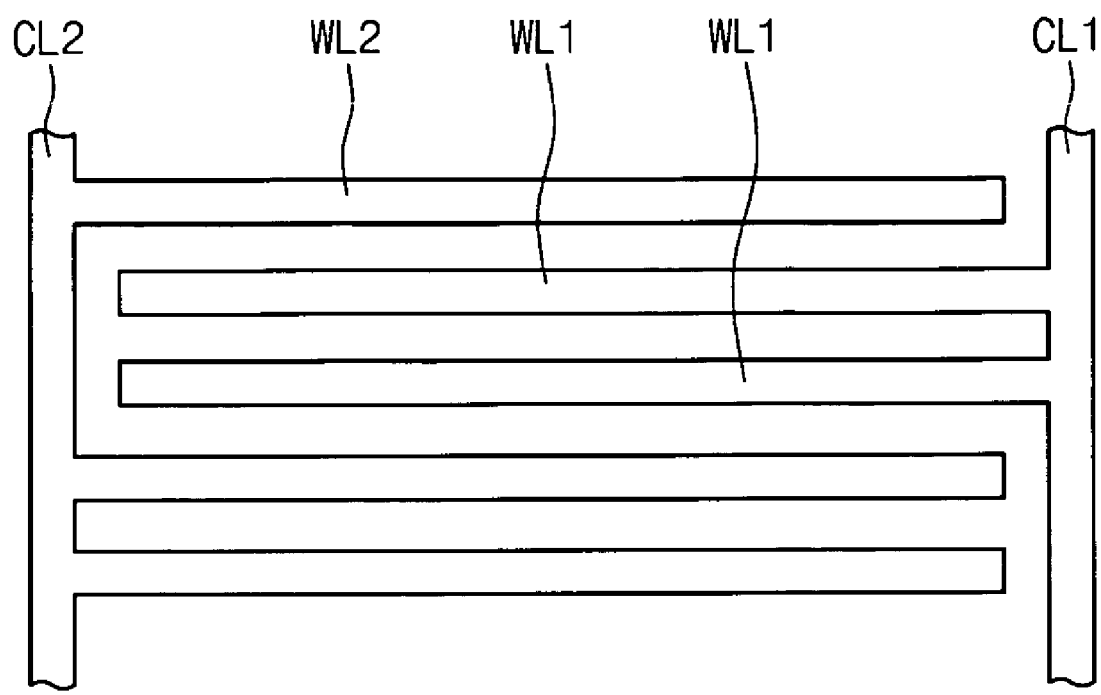
FIGS. 13A and 13B are top plan views of a nonvolatile memory device according to a fourth embodiment of the present invention.
Figure 13B:
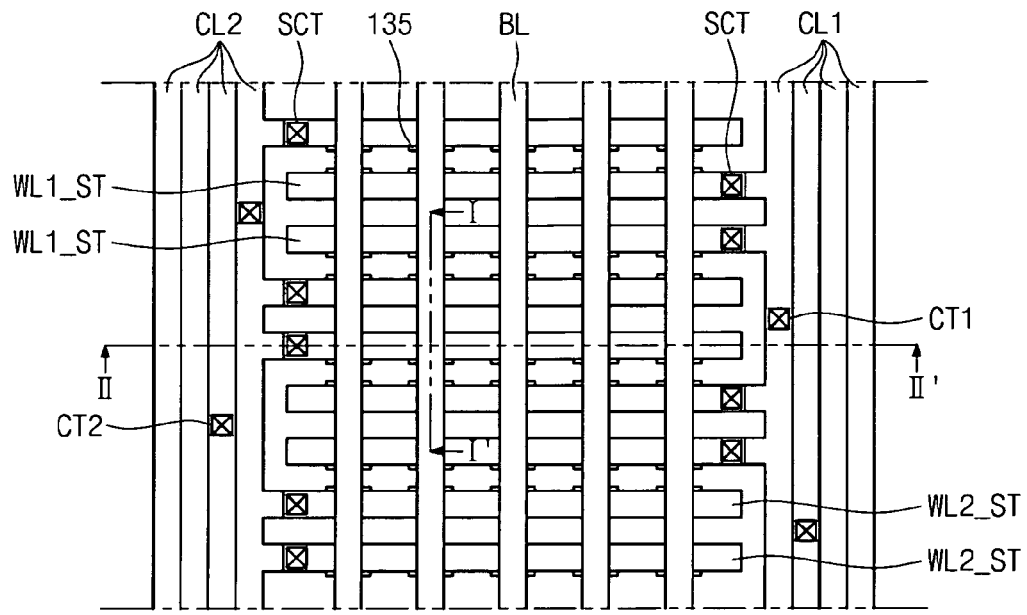

FIGS. 13A and 13B are top plan views of a nonvolatile memory device according to a fourth embodiment of the present invention. Since a nonvolatile memory device according to the fourth embodiment is similar to the first embodiment, the description of common features already discussed in the first embodiment is not repeated and different features are described in detail. For convenience, in FIG. 13A, upper selection lines USL stacked on word line stacks WL1_ST, WL2_ST respectively are not depicted and only contact plugs SCT connected to the upper selection lines USL are depicted.

Referring to FIG. 13A, first word lines WL1, second word lines WL2, a first connection line CL1 and a second connection line CL2 formed on each layer are depicted. The first and second word lines WL1, WL2 are alternately arranged two at a time along a y-axis direction.

The first word lines WL1 parallel to each other and adjacent to each other form first groups and the first groups may be disposed to be spaced apart from each other. The second word lines WL2 parallel to each other and adjacent to each other form first groups and the second groups may be disposed between the first groups.

The first connection line CL1 is connected to the first groups and the second connection line CL2 is connected to the second groups. The first connection line CL1 is connected to one end portion of the first word lines WL1 and the second connection line CL2 is connected to the other end portion of the second word lines WL2. Thus, the first and second connection lines CL1, CL2 may be symmetrically disposed with respect to the first and second word lines WL1, WL2.

A plurality of the first and second word lines WL1, WL2 and the first and second connection lines CL1, CL2 having a plane structure described above is stacked as depicted in FIG. 13B. Interlayer insulating layers 110 are interposed between the stacked first and second word lines WL1, WL2 and between the stacked first and second connection lines CL1, CL2.

Referring to FIG. 13B, first and second line stacks WL1_ST, WL2_ST are disposed on lower selection lines LSL. The interlayer insulating layers 110 are interposed between the first and second line stacks WL1_ST, WL2_ST and the lower selection lines LSL. The first and second line stacks WL1_ST, WL2_ST are alternately disposed two at a time in a y-axis direction. In a structure that the first and second word lines WL1, WL2 and the first and second connection lines CL1, CL2 are stacked in a z-axis direction, the first and second connection lines CL1, CL2 located at both side portions of the first and second line stacks WL1_ST, WL2_ST may have a laminated structure of a stair shape.

In the structure described above, charge storage pattern 132 and channel semiconductor pattern 135 are formed on one sidewall of the first and second line stacks WL1_ST, WL2_ST. Here, the charge storage pattern 132 and channel semiconductor pattern 135 are disposed to face each other between the first and second line stacks WL1_ST, WL2_ST.

Figure 14:
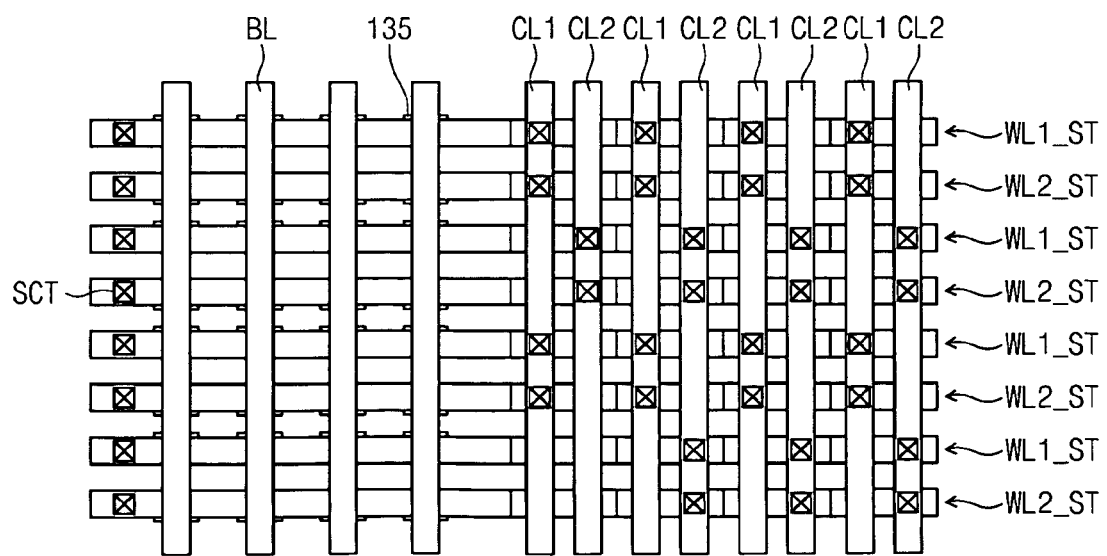
FIG. 14 is a top plan view of a nonvolatile memory device according to a fifth embodiment of the present invention.

Referring to FIG. 14, a nonvolatile memory device according to a fifth embodiment is described. FIG. 14 is a top plan view of a nonvolatile memory device according to a fifth embodiment of the present invention. Since a nonvolatile memory device according to a fifth embodiment is similar to the second and fourth embodiments, the description of common features already described in the second and fourth embodiments is not repeated and different features are described in detail.

Referring to FIG. 14, first and second word line stacks WL1_ST, WL2_ST are formed and word lines are stacked so that first end portions of the word line stacks WL1_ST, WL2_ST form a stair shape. Sidewalls of the other end portions of the word line stacks WL1_ST, WL2_ST may be aligned with one another.

The first and second word line stacks WL1_ST, WL2_ST are alternately disposed two at a time in a y-axis direction.

In the first and second word line stacks WL1_ST, WL2_ST, first and second contact plugs CT1, CT2 for first and second word lines are formed on one side portion having a stair shape.

Figure 15:
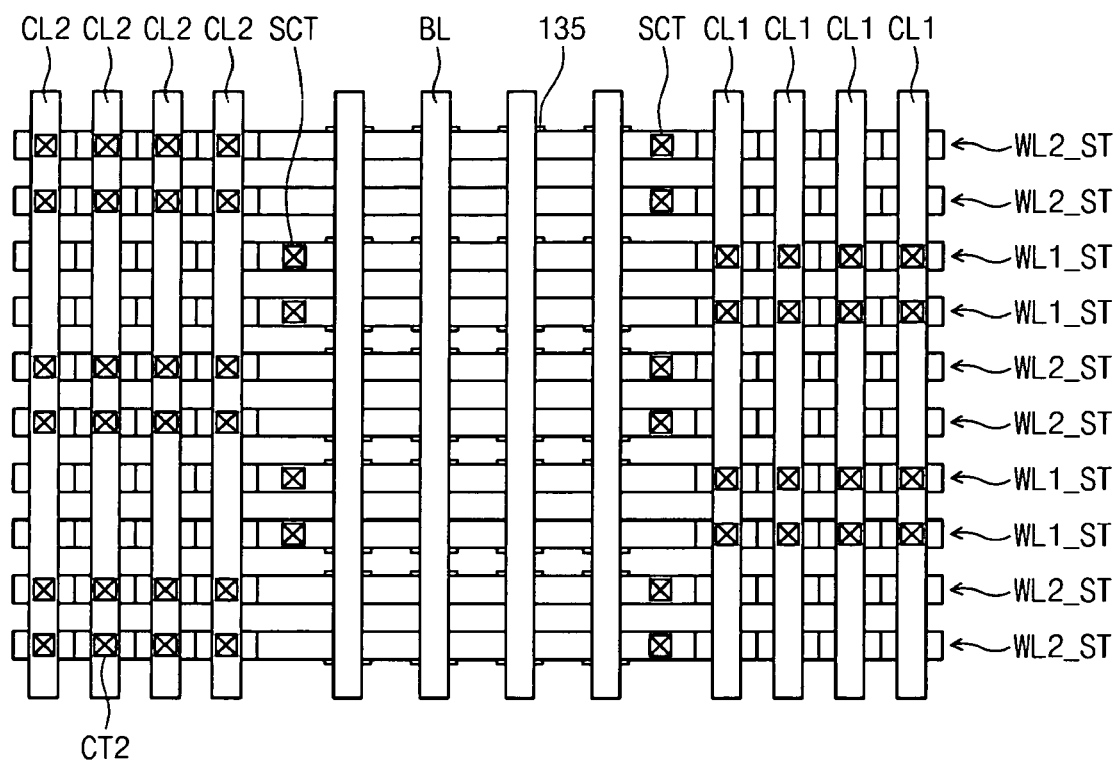
FIG. 15 is a top plan view of a nonvolatile memory device according to a sixth embodiment of the present invention.

Referring to FIG. 14, a nonvolatile memory device according to a sixth embodiment is described. FIG. 15 is a top plan view of a nonvolatile memory device according to a sixth embodiment of the present invention. Since a nonvolatile memory device according to the sixth embodiment is similar to the third and fifth embodiments, the description of common features already described in the third and fifth embodiments is not repeated and different features are described in detail.

Referring to FIG. 15, first and second word line stacks WL1_ST, WL2_ST extending in an x-axis direction and having a line shape are formed and word lines are stacked so that both side portions of the first and second word line stacks WL1_ST, WL2_ST have a stair shape.

The first and second word line stacks WL1_ST, WL2_ST are alternately disposed two at a time in a y-axis direction. The first word line stacks WL1_ST parallel to each other and adjacent to each other may form first groups and the first groups may be disposed to be spaced apart from each other. The second word line stacks WL2_ST parallel to each other and adjacent to each other may form second groups and the second groups may be disposed between the first groups.

In one side portion of the first word line stack WL1_ST, contact plugs CT1 for the first word line may be disposed on one end portion of first word lines WL1 of each layer. In the other end portion of the second word line stack WL2_ST, contact plugs CT2 for the second word line may be disposed on the other end portion of second word lines WL2 of each layer. Thus, first and second connection lines CL1, CL2 may be symmetrically disposed with respect to the first and second word line stacks WL1_ST, WL2_ST. That is, the first connection lines CL1 may be disposed on one end portion of the first and second word line stacks WL1_ST, WL2_ST and the second connection lines CL2 may be disposed on the other end portion of the first and second word line stacks WL1_ST, WL2_ST.

In the first and second word line stacks WL1_ST, WL2_ST which are alternately disposed two at a time, first word lines WL1 disposed on the same layer can be electrically connected to one another through the first connection line CL1 and second word lines WL2 disposed on the same layer can be electrically connected to one another through the second connection line CL2.

Hereinafter, a method of manufacturing a nonvolatile memory device according to embodiments of the present invention is described. A method of manufacturing the nonvolatile memory device according to the first embodiment is described in detail. The method of manufacturing the nonvolatile memory device according to the first embodiment can be applied to the second through sixth embodiments.

FIGS. 16A through 20A and FIGS. 16B through 20B are cross sectional views sequentially illustrating a method of manufacturing a nonvolatile memory device according to embodiments of the present invention.

Figure 16A:
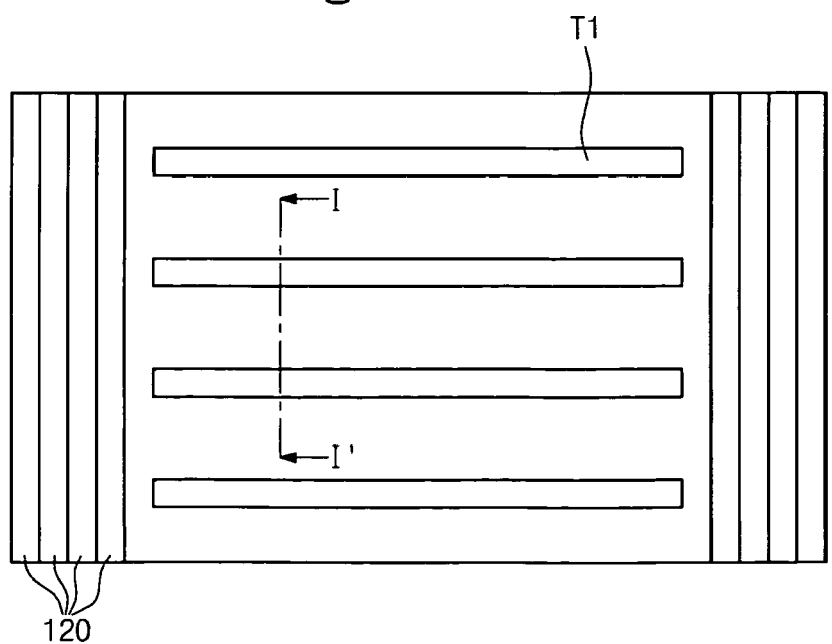
Figure 16B:
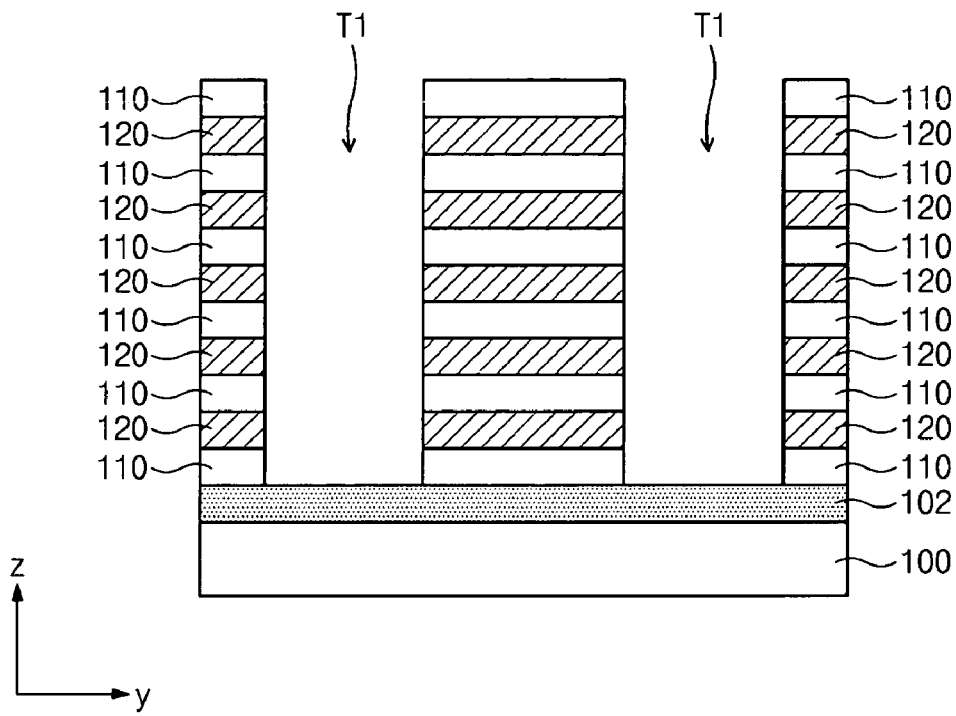

Referring to FIGS. 16A and 16B, an interlayer insulating layer 110 and a gate conductive layer 120 are alternately stacked on an entire surface of a semiconductor substrate 100. Here, the semiconductor substrate 100 may include an impurity region (or a well) 102. The interlayer insulating layer 110 may be formed of a silicon oxide layer or a silicon nitride layer and the gate conductive layer 120 may be formed of a polysilicon layer. The number of gate conductive layers 120 which are stacked may be altered according to a memory capacity.

The interlayer insulating layer 110 and the gate conductive layer 120 may be stacked as a flat board shape and may have a gradually narrowing area as the interlayer insulating layer 110 and the gate conductive layer 120 go upward. That is, the interlayer insulating layer 110 and the gate conductive layer 120 may be stacked so that edges of the interlayer insulating layer 110 and the gate conductive layer 120 are formed to be a stair shape. In the first embodiment of the present invention, both edge portions of the laminated gate conductive layers 120 may be stacked as a stair shape.

Subsequently, first trenches T1 of a line shape are formed in the laminated interlayer insulating layers 110 and the laminated gate conductive layers 120. The first trenches T1 are formed to extend in an x-axis direction, to be spaced a predetermined distance apart from each other and to be parallel to each other. Each of the first trenches T1 can expose a surface of the semiconductor substrate 100. Also, a sidewall of the interlayer insulating layer 110 and the gate conductive layer 120 may be exposed.

Figure 17A:
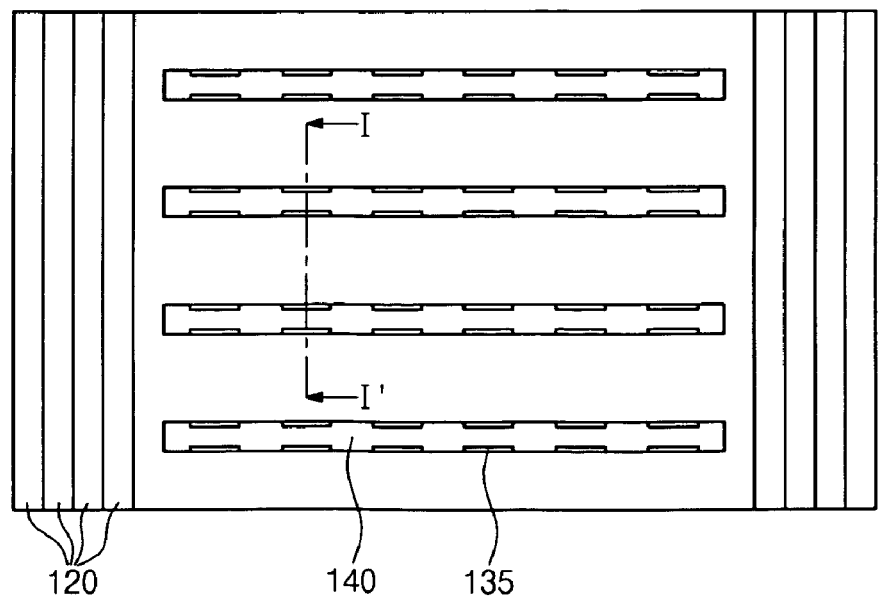
Figure 17B:
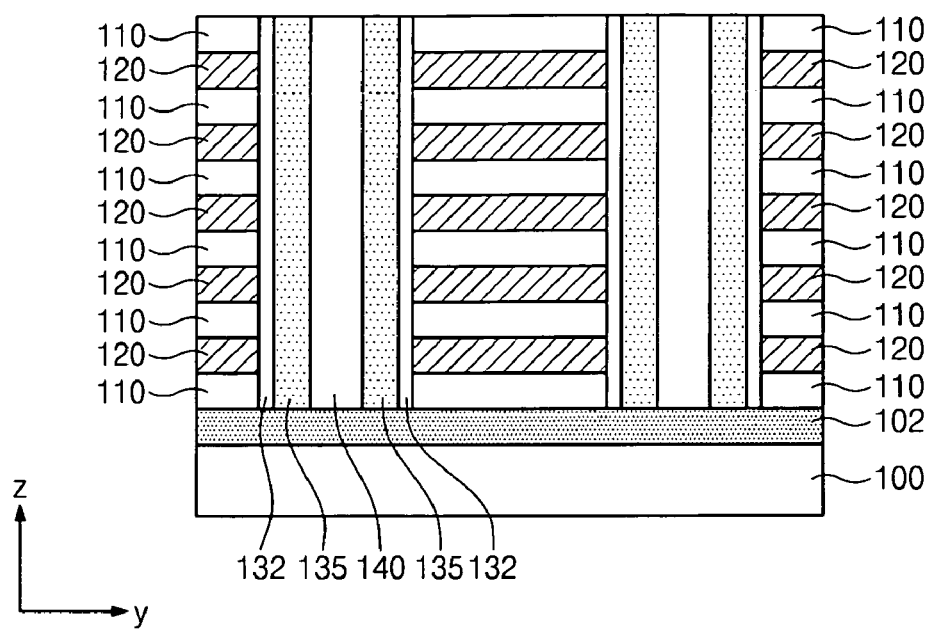

Referring to FIGS. 17A and 17B, a charge storage layer 132 and a semiconductor layer 135 are sequentially formed along a surface of the first trenches (T1). Here, the charge storage layer 132 may be a trap insulating layer (e.g., a silicon nitride layer) or a floating gate electrode and the semiconductor layer 135 may be a poly-crystalline semiconductor or a single-crystalline semiconductor. Next, an entire surface of the charge storage layer 132 and the semiconductor layer 135 is anisotropically etched to form the charge storage layer 132 and the semiconductor layer 135 covering the sidewall of the first trenches T1. That is, the charge storage layer 132 and the semiconductor layer 135 may cover an entire portion of the sidewall of the interlayer insulating layers 110 and the gate conductive layers 120 exposed by the first trenches T1.

The charge storage layer 132 and the semiconductor layer 135 formed on an entire portion of the sidewall of the first trenches T1 may be patterned along a y-axis direction. As a result, the charge storage layer 132 and the semiconductor layer 135 disposed to be spaced a predetermined distance apart from each other along a major axis of the first trench T1 may be formed on the sidewall of the patterned interlayer insulating layer 110 and the patterned gate conductive layer 120. That is, the charge storage layer 132 and the semiconductor layer 135 of a line shape extending in a z-axis direction from a surface of the semiconductor substrate 100 may be formed. The charge storage layer 132 and the semiconductor layer 135 may be in contact with the impurity region 102 in the semiconductor substrate 100.

Subsequently, the first trench T1 including the charge storage layer 132 and the semiconductor layer 135 is filled with an insulating layer 140 and then planarized.

Figure 18A:
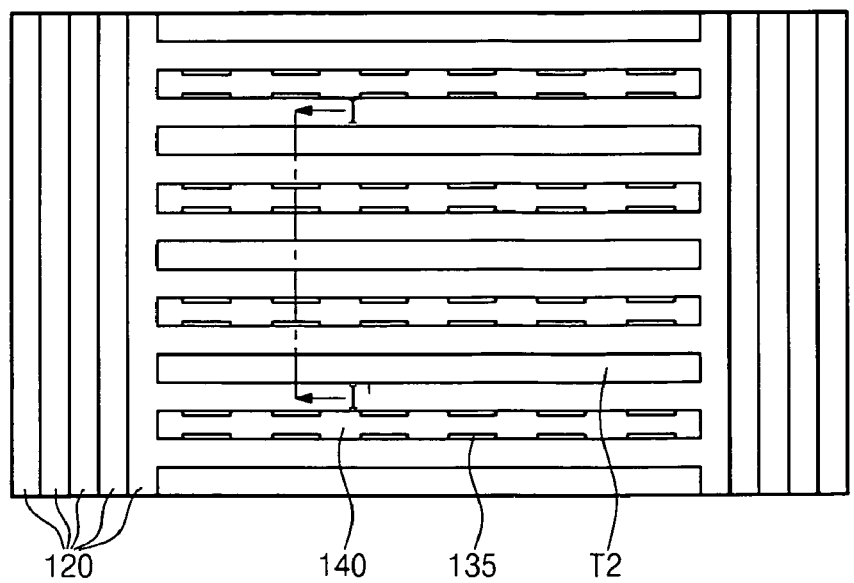
Figure 18B:
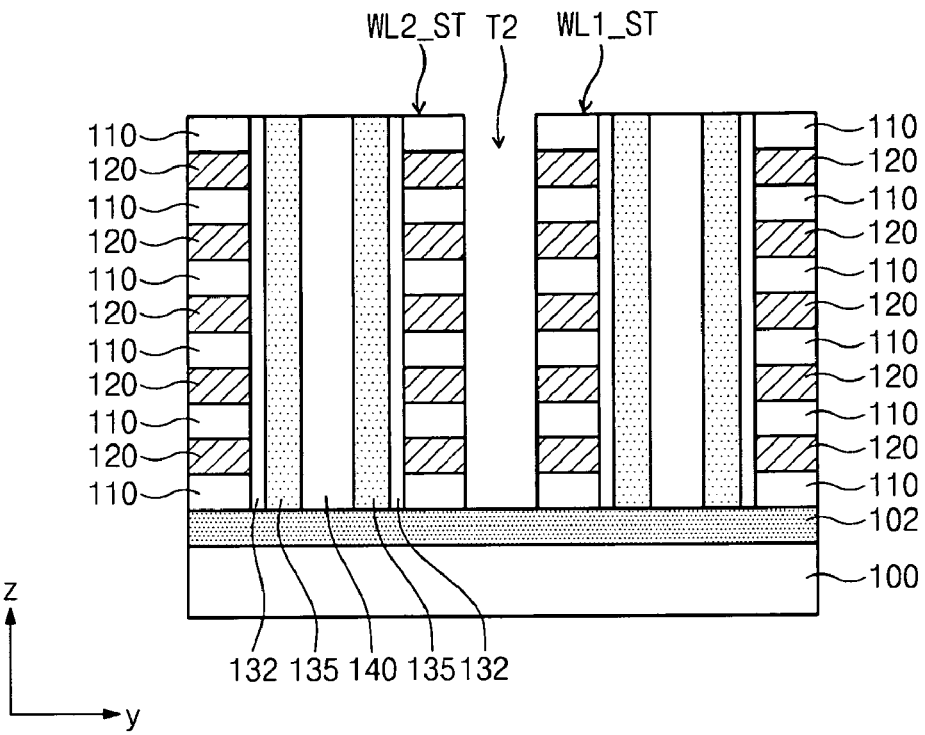

Referring to FIGS. 18A and 18B, second trenches T2 of a line shape are formed between the first trenches T1. The second trenches T2 can expose a surface of the semiconductor substrate 100. Stacks of interlayer insulating layer and conductive layer having a line shape may be formed between the first trench T1 and the second trench T2 by forming the second trenches T2.

Figure 19A:
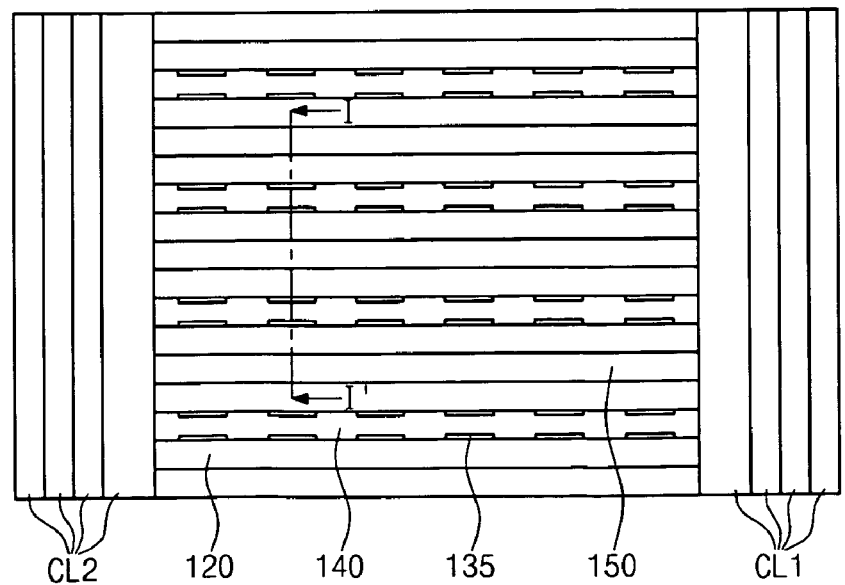
Figure 19B:
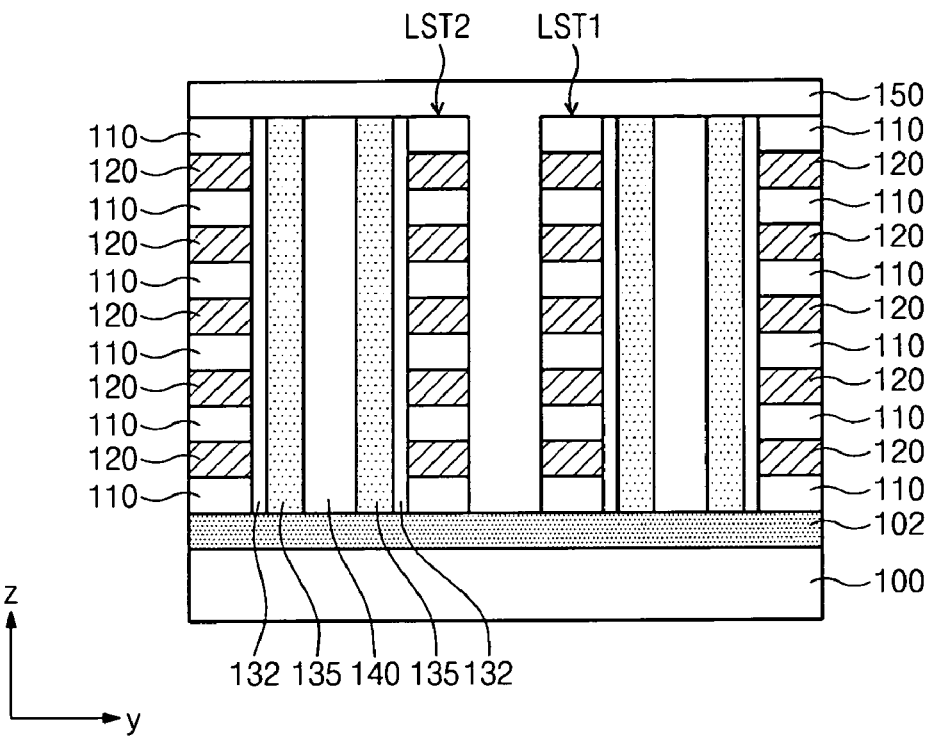

Referring to FIGS. 19A and 19B, the second trenches T2 are filled with an insulating layer 150 and then planarized.

The interlayer insulating layers 110 and the gate conductive layers 120 of a flat board shape may be formed to be a ladder shape by the first and second trenches T1, T2. More specifically, line patterns extending in the x-axis direction are formed at a center portion of the stacked layers, and both edge portions of the line patterns extending in the x-axis direction may be connected to each other.

In the first embodiment, a portion connecting the line pattern at each layer of the gate conductive layers 120 is called a first connection line CL1 or a second connection line CL2 and the first and second connection lines CL1, CL2 extend in the y-axis direction. The conductive line stacks extending in the x-axis direction are formed between the first and second connection lines CL1, CL2.

The interlayer insulating layer 110 and the gate conductive layer 120 located at the top layer may be patterned to have a line shape separated by the first and second trenches T1, T2 to form an upper selection lines USL.

Figure 20A:
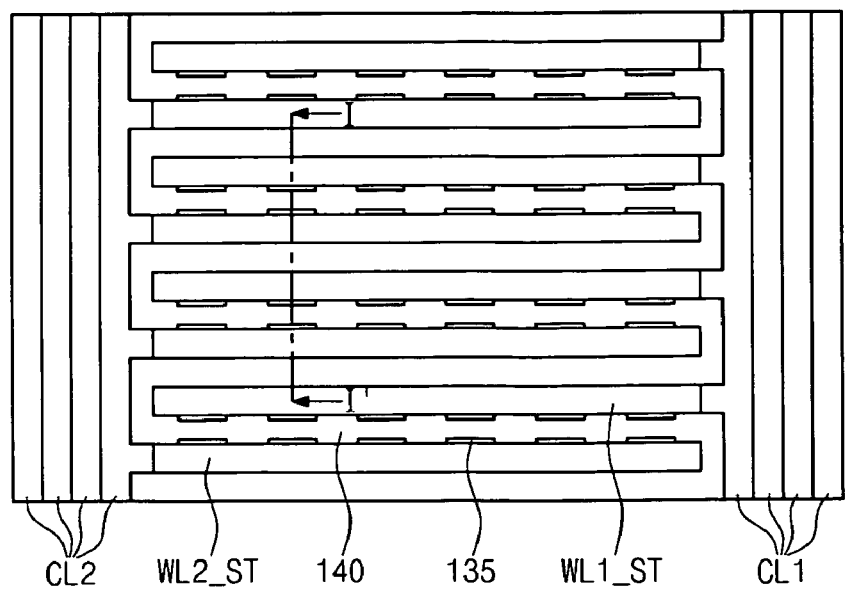
Figure 20B:
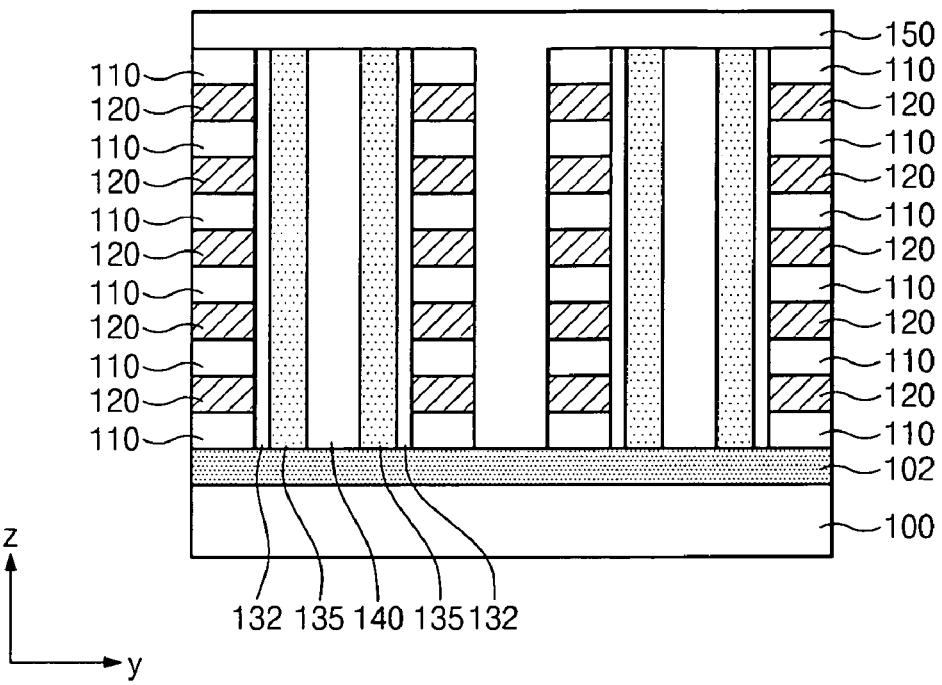

Referring to FIGS. 20A and 20B, line patterns 120 may be patterned so that the line patterns 120 connected to the first and second connection lines CL1, CL2 are connected to only one of the first and second connection lines CL1, CL2. More specifically, first end portions of the line patterns 120 located at odd number positions among the line patterns 120 extending in the x-axis direction are patterned and the other end portions of the line patterns 120 located at even number positions among the line patterns 120 extending in the x-axis direction are patterned. As a result, word lines having a finger shape may be formed.

That is, first word line stacks WL1_ST and the second connection line CL2 may be separated, and second word line stacks WL2_ST and the first connection line CL1 may be separated. Accordingly, the first and second word line stacks WL1_ST, WL2_ST which are electrically separated may be formed. In the first word line stacks WL1_ST, first word lines WL1 can be connected to the first connection line CL1 corresponding to each layer; and, in the second word line stacks WL2_ST, second word lines WL2 can be connected to the second connection line CL2 corresponding to each layer.

Referring back to FIGS. 4B, 5A and 5B, after forming the first and second word line stacks WL1_ST, WL2_ST which are electrically separated, bit lines BL connected to the channel semiconductor pattern 135 formed between the first and second word line stacks WL1_ST, WL2_ST are formed. The bit lines BL extend in the y-axis direction crossing the first and second word line stacks WL1_ST, WL2_ST and may be electrically connected to the channel semiconductor patterns 135 through contact plugs.

Word line contact plugs CT1, CT2 for connecting metal interconnections are formed on each layer of the laminated first and second connection lines CL1, CL2. Since the first and second connection lines CL1, CL2 are symmetrically disposed with respect to the first and second word lines WL1, WL2, the first word line contact plugs CT1 and the second word line contact plugs CT2 may also be symmetrically disposed with respect to the first and second word lines WL1, WL2.

Selection line contact plugs SCT for connecting metal interconnections are formed on each of upper selection lines USL. The selection line contact plugs SCT may be formed on edge portions of the upper selection lines USL considering a process margin of metal interconnections.

A method of manufacturing the nonvolatile memory device according to the second through sixth embodiments is described in detail. Since the method of manufacturing the nonvolatile memory device according to the second through sixth embodiments is similar to the method of manufacturing the nonvolatile memory device according to the first embodiment, only differences are described in detail. Description of similar features will not be repeated.

Referring to FIGS. 8A, 8B, 11A and 11B, a plurality of the interlayer insulating layers 110 and the gate conductive layers 120 are stacked on the semiconductor substrate 100. Here, the interlayer insulating layers and the gate conductive layers 120 may be stacked to have first edge portions or both edge portions of a stair shape.

The interlayer insulating layers 110 and the gate conductive layers 120 stacked as a stair shape are formed as line patterns separated from each other. That is, line pattern stacks extending in the x-axis direction may be formed. The line pattern stacks may be divided into first and second word line stacks WL1_ST, WL2_ST. The first and second line stacks WL1_ST, WL2_ST are alternately disposed one by one or two at a time.

After forming line pattern stacks, the charge storage pattern 132 and the channel semiconductor pattern 135 are formed on one sidewall of each line pattern stack.

More specifically, after forming the first and second word line stacks WL1_ST, WL2_ST, an insulating layer may alternately fill a space between the first and second word line stacks WL1_ST, WL2_ST. That is, one sidewall of the first word line stack WL1_ST and the other sidewall of the second word line stack WL2_ST may be exposed. An insulating layer 150 may fill a space between one sidewall of the second word line stack WL2_ST and the other sidewall of first word line stack WL1_ST.

The charge storage patterns 132 and the channel semiconductor patterns 135 are formed on the sidewalls of the first and second word line stacks WL1_ST, WL2_ST facing each other. An insulating layer covering the first and second word line stacks WL1_ST, WL2_ST is formed and bit lines BL electrically connected to the channel semiconductor patterns 135 are formed. Contact plugs for the bit line BL may be formed on the channel semiconductor patterns 135 respectively. The bit lines BL may be formed to cross the first and second word line stacks WL1_ST, WL2_ST.

After forming the bit lines BL, the first connection lines CL1 connecting the first word lines WL1 and the second connection lines CL2 connecting the second word lines WL2 are formed on each layer.

More specifically, the contact plugs CT1, CT2 for word lines are formed on one edge portions of the first and second word line stacks WL1_ST, WL2_ST respectively. At this time, in the first and second word line stacks WL1_ST, WL2_ST which are alternately disposed, the contact plugs CT1 for word lines may be formed on one end portions of the first word line stacks WL1_ST and the contact plugs CT2 for word lines may be formed on the other end portions of the second word line stacks WL2_ST.

Subsequently, metal interconnections connected to the contact plugs CT1, CT2 for word lines located at the same layer may be formed. That is, the first word lines may be electrically connected to the first connection lines CL1 through the contact plugs CT1 for word lines. Thus, the number of first connection lines CL1 may be formed to be the same as the number of the laminated gate conductive layers 120.

Also, the second word lines may be electrically connected to the second connection lines CL2 through the contact plugs CT2 for word lines. Each of the second connection lines CL2 may electrically connect the second word lines located at the same layer.

FIGS. 21 through 27 are cross sectional views sequentially illustrating another method of manufacturing a nonvolatile memory device according to embodiments of the present invention. Referring to FIGS. 21 through 27, this other method of manufacturing a nonvolatile memory device according to embodiments of the present invention is described in detail. In this other method of manufacturing a nonvolatile memory device according to embodiments of the present invention, channel semiconductor patterns may be formed before forming word lines.

Figure 21:
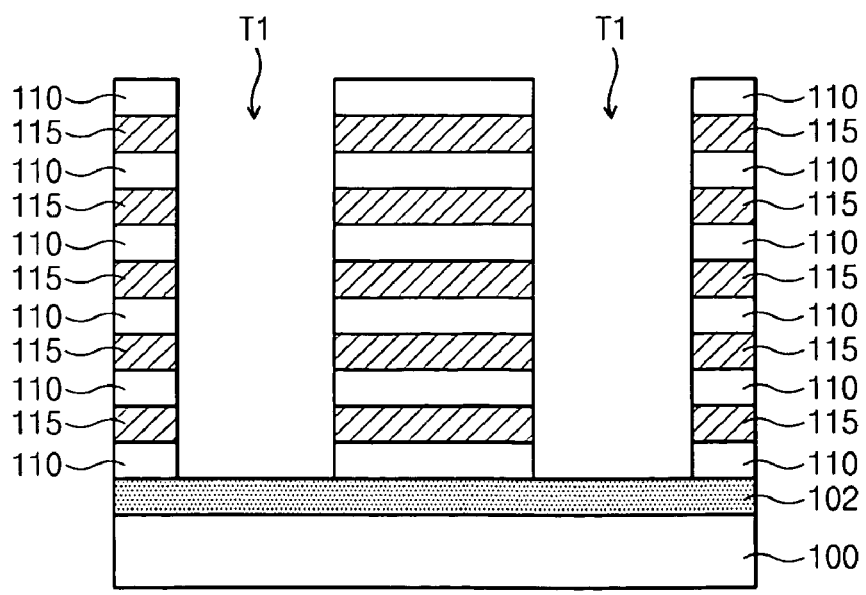
FIGS. 21 through 27 are cross sectional views sequentially illustrating another method of manufacturing a nonvolatile memory device according to embodiments of the present invention.

Referring to FIG. 21, a plurality of interlayer insulating layers 110 and sacrificial layers 115 are alternately stacked on a semiconductor substrate. The sacrificial layer 115 may be formed of a material having an etching selectivity with respect to the interlayer insulating layer 110. The interlayer insulating layer 110 and the sacrificial layer 115 may, for example, be formed of a silicon oxide layer or a silicon nitride layer.

The laminated interlayer insulating layer 110 and the sacrificial layer 115 are patterned to form line shaped interlayer insulating layer and sacrificial layer stacks. A first trench T1 may be formed between the patterned interlayer insulating layer and sacrificial layer stacks. Here, the patterned interlayer insulating layer and sacrificial layer may be formed to have a ladder shape or may be formed of separated line patterns.

Channel semiconductor patterns 135 are formed on sidewalls of the interlayer insulating layer and sacrificial layer exposed by the first trenches T1. The channel semiconductor patterns 135 may cover an entire portion of the sidewalls or may be disposed to spaced a predetermined distance apart from each other on the sidewalls.

Figure 22:
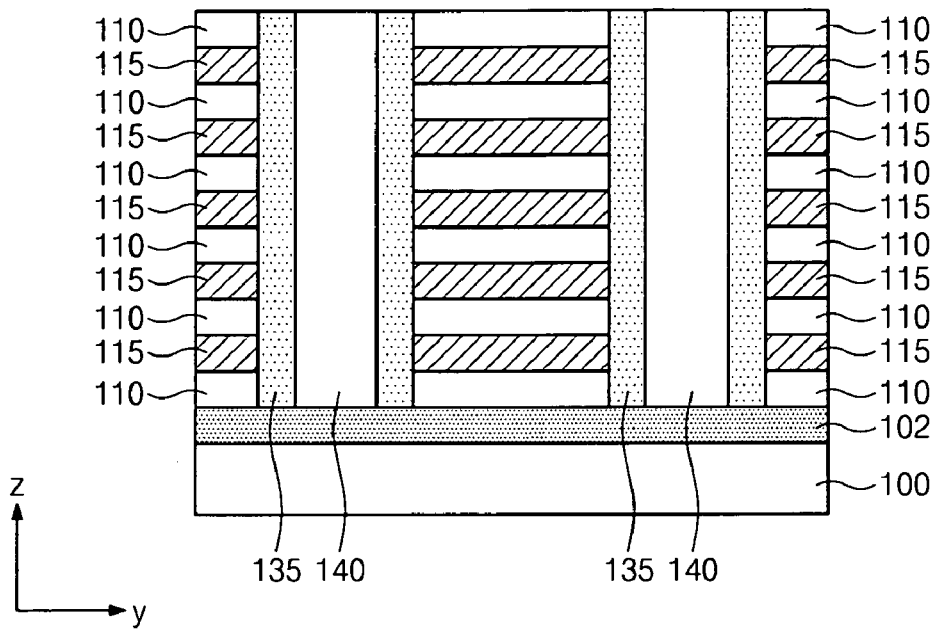

As described in FIG. 22, an insulating layer 140 fills a space between the channel semiconductor patterns 135. That is, the insulating layer 140 fills the first trenches T1 and is planarized.

Figure 23:
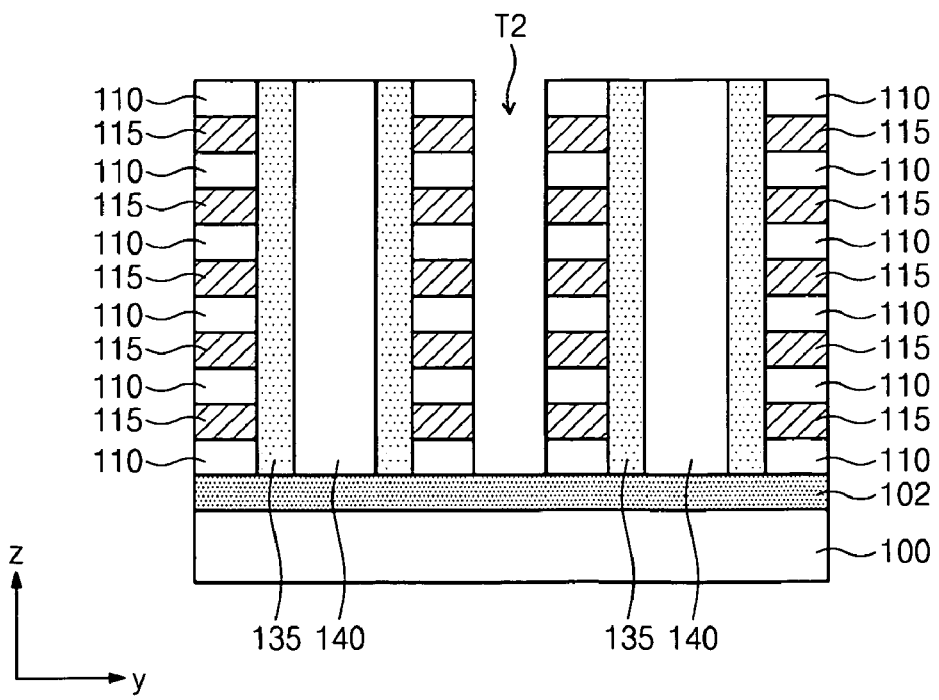

Referring to FIG. 23, a second trench T2 is formed in the interlayer insulating layer and sacrificial layer stack disposed between the first trenches T1 filled with the insulating layer 140. A sidewall of the interlayer insulating layer and sacrificial layer stack may be exposed by the second trench T2.

Figure 24:
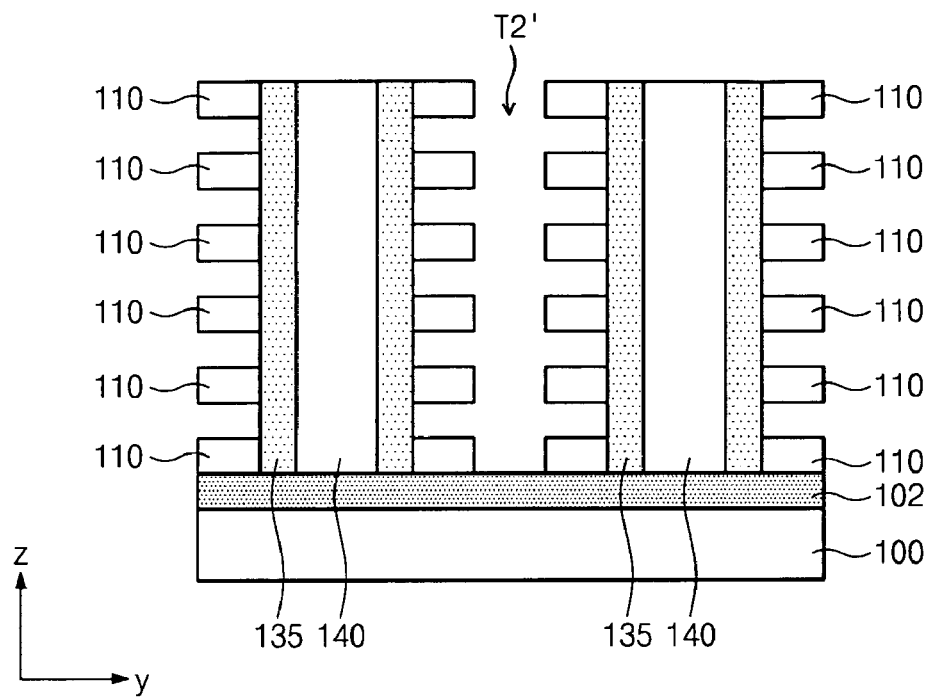

Referring to FIG. 24, an etching solution selectively etching the sacrificial layer 115 is supplied to remove the sacrificial layers 115 exposed by the second trench T2. The second trench T2' may expose a portion of a sidewall of the channel semiconductor pattern 135 by removing the sacrificial layer 115 using a wet etching.

Figure 25:
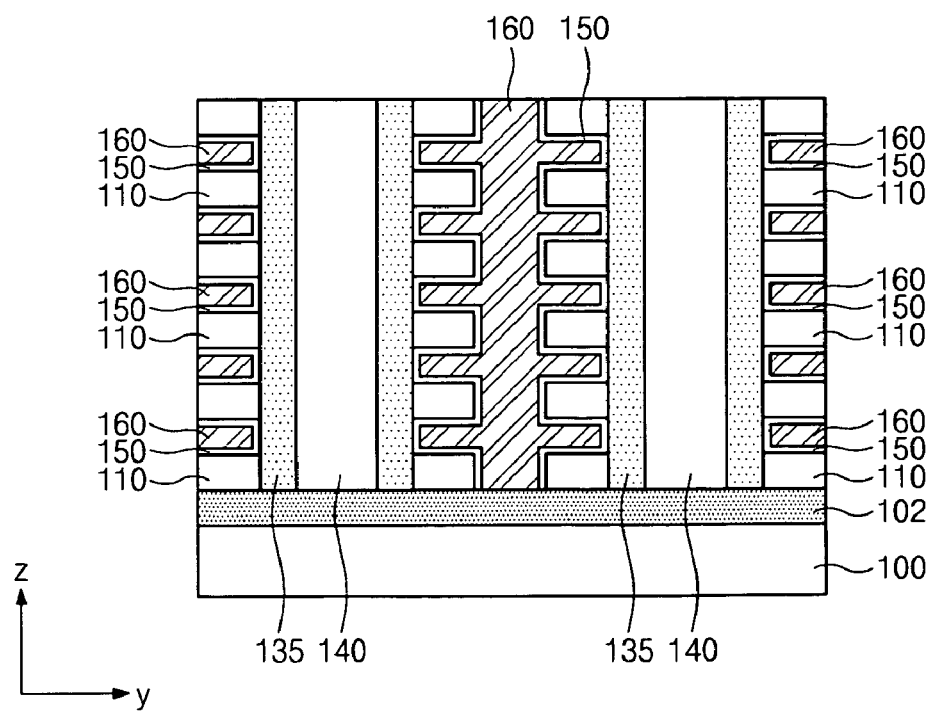

Referring to FIG. 25, a charge storage layer 150 is conformally formed along the second trench T2' exposing a portion of a sidewall of the channel semiconductor pattern 135. That is, the charge storage layer 150 may be formed on a portion of a sidewall of the channel semiconductor pattern 135 and on a top surface, a bottom surface and one side surface of the interlayer insulating layer pattern 110.

After that, a gate conductive layer 160 completely filling the second trench T2' is formed on the charge storage layer 150. Accordingly, the gate conductive layer 160 may fill a space between the interlayer insulating layer patterns 110.

Figure 26:
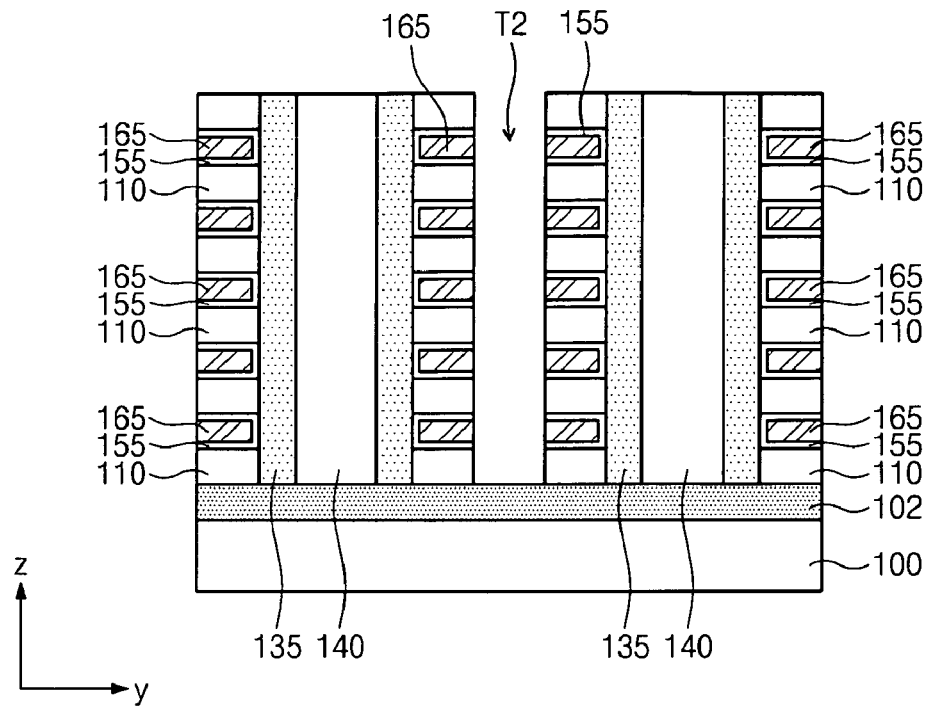

Referring to FIG. 26, the charge storage layer 150 and the gate conductive layer 160 are patterned so that a charge storage pattern 155 and a word line 165 are formed on a top surface and a bottom surface of the interlayer insulating layer pattern 110. That is, the gate conductive layer 160 can be divided into the word lines 165 of a line shape. Thus, the word lines 165 may be formed between the interlayer insulating layer patterns 110. The word lines 165 and the interlayer insulating layer patterns 110 may have a structure stacked along a z-axis direction.

Figure 27:
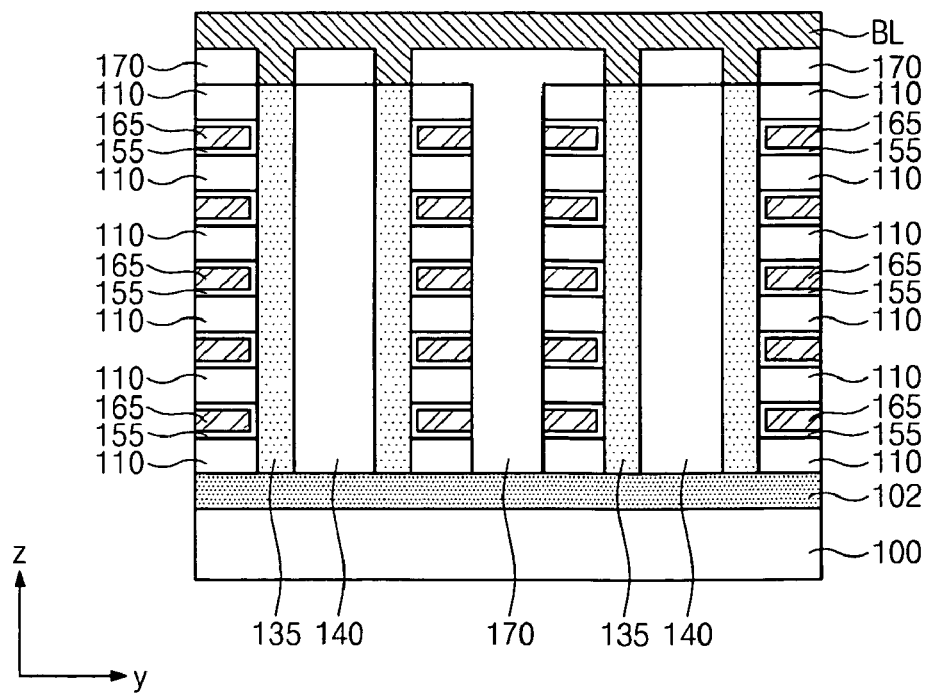

Referring to FIG. 27, bit lines BL electrically connected to the channel semiconductor pattern 135 may be formed on a top surface of the laminated word lines.

In another method of manufacturing a nonvolatile memory device, a method of forming first and second lines may be identical to the manufacturing method described above. Thus, when forming the word lines 165, the first and second connection lines may be simultaneously formed. Also, after forming the word lines 165, contact plugs may be formed on the word lines to connect the first and second connection lines.

Figure 28:
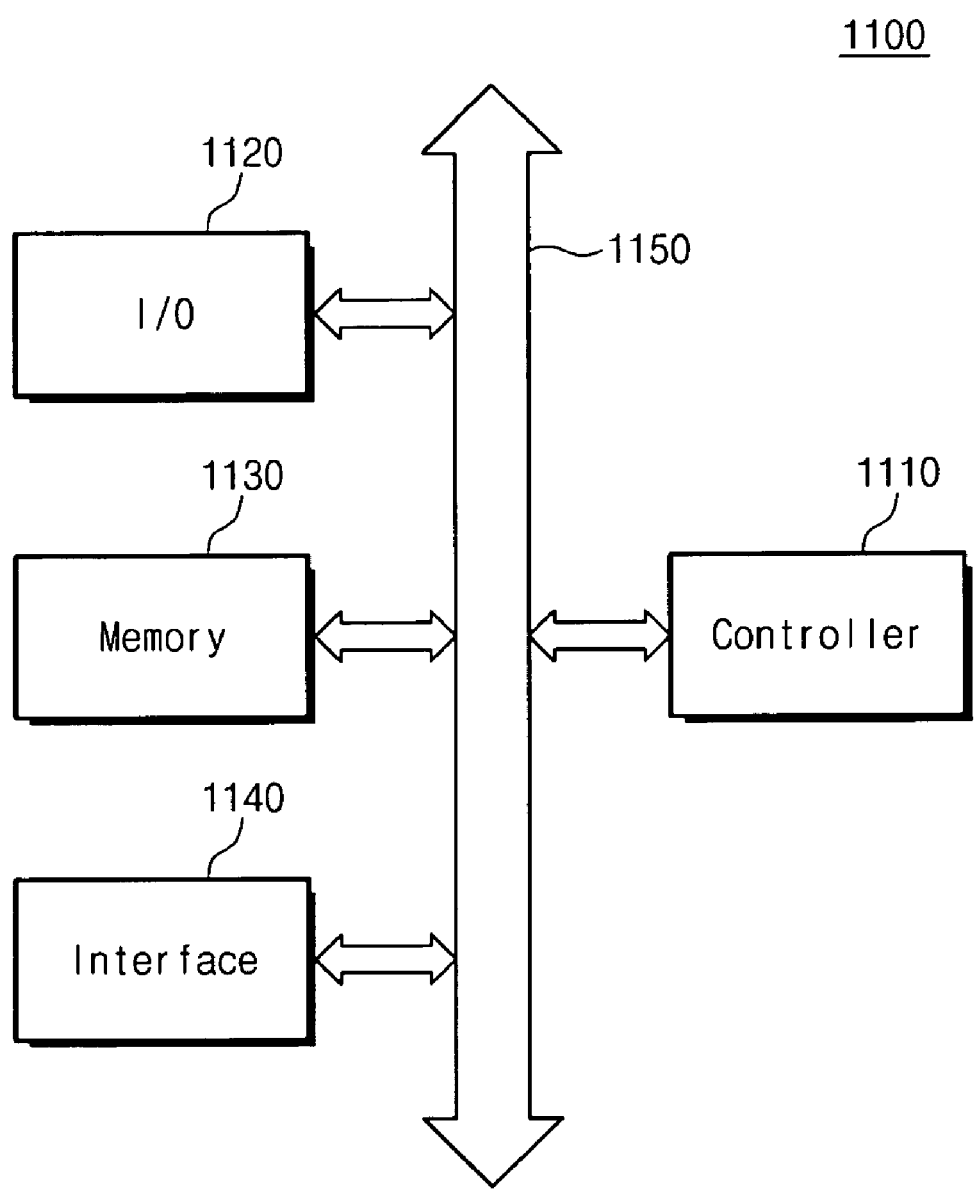
FIG. 28 is a block diagram illustrating an example of a memory system including a nonvolatile memory device according to embodiments of the present invention.

FIG. 28 is a block diagram illustrating an example of a memory system including a nonvolatile memory device according to embodiments of the present invention.

Referring to FIG. 28, a memory system 1100 may be applied to a personal digital assistant (PDA), a portable computer, a web tablet, a mobile phone, a wireless phone, a memory card, a digital music system or all the devices that can transmit and/or receive data in a wireless environment.

The memory system 1100 may include a controller 1110, an input/output device 1120 such as a keypad, a keyboard and a displayer, a memory 1130, an interface 1140 and a bus 1150. The memory 1130 and the interface 1140 communicate with each other via the bus 1150.

The controller 1110 may include at least one microprocessor, digital signal processor, micro controller or other processor devices similar to microprocessor, digital signal processor and micro controller. The memory 1130 may be used to store an instruction executed by the controller 1110. The input/output device 1120 may receive data or a signal from the outside of the system 1100 or transmit data or a signal to the outside of the system 1100. For example, the input/output device 1120 may include a keypad, a keyboard or a display device.

The memory 1130 may include a nonvolatile memory device according to embodiments of the present invention. The memory 1130 may further include a different kind of memory, a volatile memory capable of a random access and various kinds of memories.

The interface 1140 transmits data to a communication network or receives data from a communication network.

Figure 29:
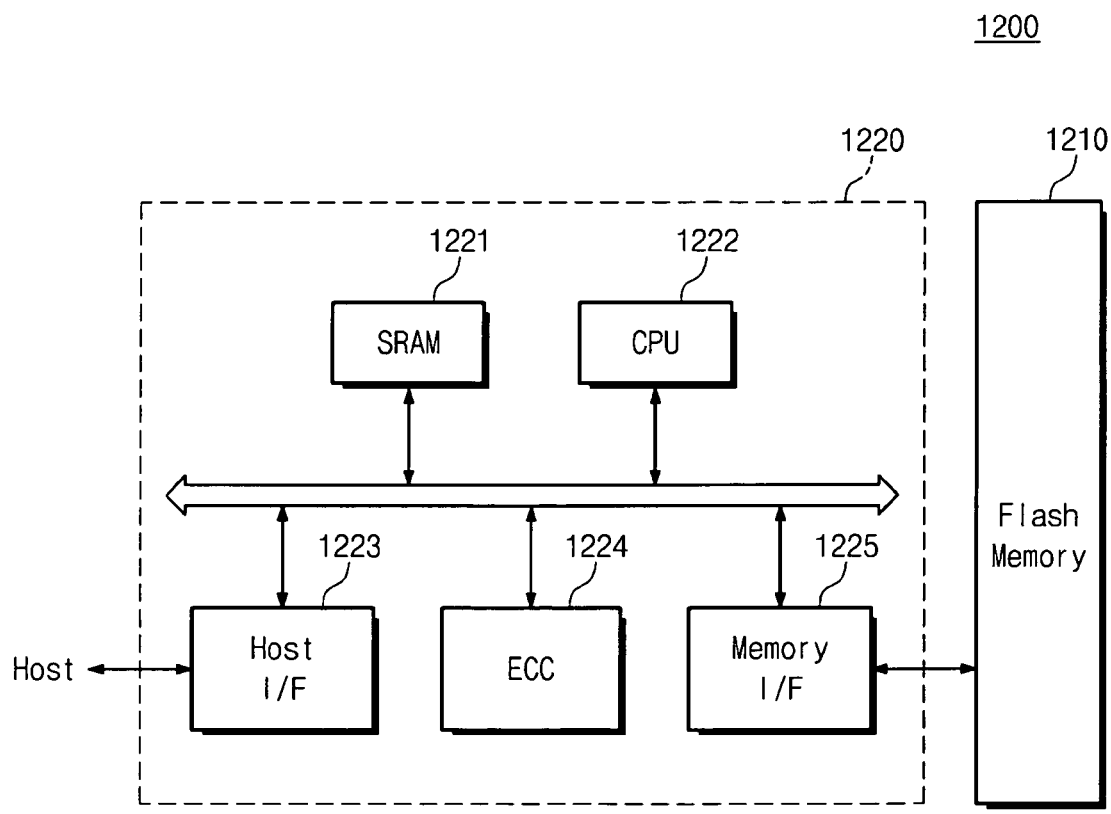
FIG. 29 is a block diagram illustrating an example of a memory card including a nonvolatile memory device according to embodiments of the present invention.

FIG. 29 is a block diagram illustrating an example of a memory card including a nonvolatile memory device according to embodiments of the present invention.

Referring to FIG. 29, a memory card 1200 for supporting data storage capability of a high capacity may be fitted with a flash memory device 1210 according to the present invention. The memory card 1200 may include a memory controller 1220 controlling all data exchanges between a host and the flash memory device 1210.

SRAM 1221 is used as an operation memory of a processing unit 1222. A host interface 1223 includes data exchange protocols of a host connected to the memory card 1200. An error correction block 1224 detects errors included in data read from a multi-bit flash memory device 1210 and corrects the errors. A memory interface 1225 interfaces the flash memory device 1210 of the present invention. The processing unit 1222 executes all control operations for a data exchange of the memory controller 1220. The memory card 1200 may further include ROM (not shown) storing code data for interfacing the host.

According to the flash memory device, the memory card and the memory system of the present invention, a memory system having high reliability may be provided through the flash memory system including dummy cells having an improved erasure characteristic. In particular, the flash memory device of the present invention may be provided to a memory system such as a solid state disk (SSD). In this case, a memory system having high reliability may be embodied by cutting off read errors caused by dummy cells.

Figure 30:
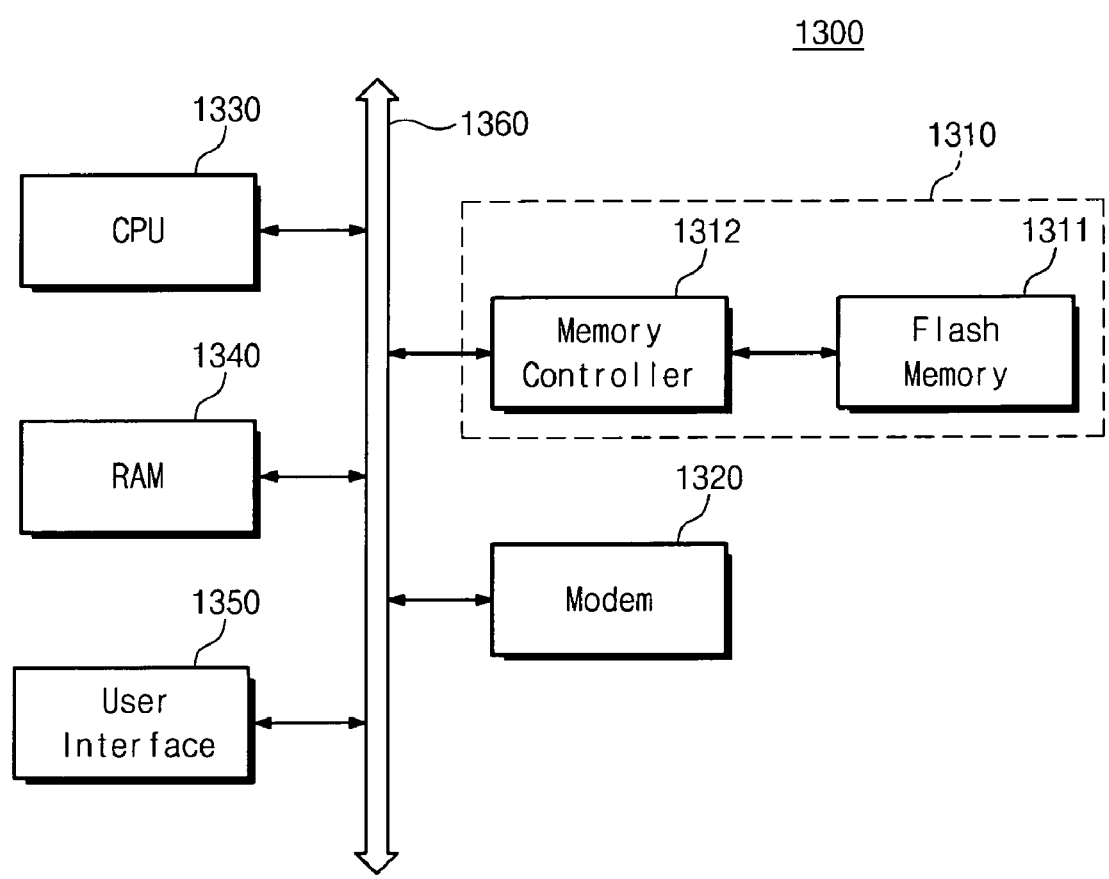
FIG. 30 is a block diagram illustrating an example of a data processing system including a nonvolatile memory device according to embodiments of the present invention.

FIG. 30 is a block diagram illustrating an example of a data processing system including a nonvolatile memory device according to embodiments of the present invention.

Referring to FIG. 30, a memory system 1310 is built in a data processing system such as a mobile device or a desk top computer. The data processing system 1300 according to the present invention may include a flash memory system 1310, a modem 1320, a central processing unit 1330, a RAM 1340 and a user interface 1350 that are electrically connected to a system bus 1360. The flash memory system 1310 may be configured to be substantially identical to the memory system or the flash memory system described above. Data processed by the central processing unit 1330 or data received from the outside are stored in the flash memory system 1310. The flash memory system 1310 may include a solid state disk (SSD) and in this case, the data processing system 1300 can stably store large amounts of data in the flash memory system 1310. As reliability is improved, the flash memory system 1310 can reduce resources used to correct errors, thereby providing a high-speed data exchange, function to the data processing system 1300. The data processing system 1300 may further include an application chip set, a camera image processor (CIS) and an input/output device.

The flash memory device and the memory system according to the present invention may be mounted as various kinds of packages. For example, the flash memory device and the memory system may be packaged as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), wafer-level processed stack package (MCP), wafer-level fabricated package (WFP), wafer-level processed stack package (WSP) and mounted.

Although some embodiments of the present general inventive concept have been shown and described, it will be understood by those skilled in the art that changes may be made in these embodiments without departing from the principles and spirit of the general inventive concept, the scope of which is defined in the appended claims and their equivalents. Therefore, the above-described subject matter is to be considered illustrative, and not restrictive.

What is claimed is:

1. A nonvolatile memory device comprising:
a plurality of first word line stacks in which first word lines are stacked;
a plurality of second word line stacks in which second word lines parallel to the first word lines are stacked;
a plurality of first connection lines connecting the first word lines;
a plurality of second connection lines connecting the second word lines;
channel semiconductor patterns formed on one sidewall of each of the first and second word line stacks; and
a charge storage layer formed between one sidewall of each of the first and second word line stacks and the channel semiconductor patterns,
wherein each of the first connection lines connects the first word lines located at a common first word line layer, wherein each of the second connection lines connects the second word lines located at a common second word line layer and wherein at least one second word line stack is disposed between a pair of the first word line stacks.

2. The nonvolatile memory device of claim 1, wherein the first and second word line stacks are alternately disposed one by one.

3. The nonvolatile memory device of claim 1, wherein a pair of the first word line stacks adjacent to each other forms a plurality of first groups, wherein a pair of the second word line stacks adjacent to each other forms a plurality of second groups and wherein the first and second groups are alternately disposed one by one.

4. The nonvolatile memory device of claim 1, wherein the first connection lines are electrically separated from the second word lines and wherein the second connection lines are electrically separated from the first word lines.

5. The nonvolatile memory device of claim 1, wherein each of the first and second connection lines is formed on the same layer as the first and second word lines.

6. The nonvolatile memory device of claim 5, wherein the first and second connection lines are disposed on both sides of the first and second word lines.

7. The nonvolatile memory device of claim 1, wherein each of the first and second connection lines is formed on a layer different from the first and second word lines.

8. The nonvolatile memory device of claim 7, wherein the first and second connection lines are disposed on both sides of the first and second word lines or on one side of the first and second word lines.

9. The nonvolatile memory device of claim 1, wherein channel semiconductor patterns formed on one sidewall of the first word line stacks and channel semiconductor patterns formed on one sidewall of the second word line stacks are formed to face each other.

10. A nonvolatile memory device comprising:
a plurality of first word line stacks in which first word lines are stacked;
a plurality of second word line stacks in which second word lines parallel to the first word lines are stacked;
a plurality of first connection lines connecting the first word lines; and
a plurality of second connection lines connecting the second word lines,
wherein each of the first connection lines connects the first word lines located at a common first word line layer, wherein each of the second connection lines connects the second word lines located at a common second word line layer and wherein at least one second word line stack is disposed between a pair of the first word line stacks,
wherein each of the first and second connection lines is formed on the same layer as the first and second word lines, and
wherein the first and second connection lines are disposed on both sides of the first and second word lines.

11. The nonvolatile memory device of claim 10, wherein the first and second word line stacks are alternately disposed one by one.

12. The nonvolatile memory device of claim 10, wherein a pair of the first word line stacks adjacent to each other forms a plurality of first groups, wherein a pair of the second word line stacks adjacent to each other forms a plurality of second groups and wherein the first and second groups are alternately disposed one by one.

13. The nonvolatile memory device of claim 10, wherein the first connection lines are electrically separated from the second word lines and wherein the second connection lines are electrically separated from the first word lines.

14. A nonvolatile memory device comprising:
- a plurality of first word line stacks in which first word lines are stacked;
- a plurality of second word line stacks in which second word lines parallel to the first word lines are stacked;
- a plurality of first connection lines connecting the first word lines; and
- a plurality of second connection lines connecting the second word lines,
- wherein each of the first connection lines connects the first word lines located at a common first word line layer, wherein each of the second connection lines connects the second word lines located at a common second word line layer and wherein at least one second word line stack is disposed between a pair of the first word line stacks, and
- wherein each of the first and second connection lines is formed on a layer different from the first and second word lines.

15. The nonvolatile memory device of claim 14, wherein the first and second connection lines are disposed on both sides of the first and second word lines or on one side of the first and second word lines.

16. The nonvolatile memory device of claim 14, wherein the first and second word line stacks are alternately disposed one by one.

17. The nonvolatile memory device of claim 14, wherein a pair of the first word line stacks adjacent to each other forms a plurality of first groups, wherein a pair of the second word line stacks adjacent to each other forms a plurality of second groups and wherein the first and second groups are alternately disposed one by one.

18. The nonvolatile memory device of claim 14, wherein the first connection lines are electrically separated from the second word lines and wherein the second connection lines are electrically separated from the first word lines.

* * * * *